(12) United States Patent
Chen et al.

(10) Patent No.: US 12,074,026 B2
(45) Date of Patent: Aug. 27, 2024

(54) INTEGRATED PHOTORESIST REMOVAL AND LASER ANNEALING

(71) Applicant: Taiwan Semiconductor Manufacturing Co., Ltd., Hsinchu (TW)

(72) Inventors: Tz-Shian Chen, Hsinchu (TW); Li-Ting Wang, Hsinchu (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/749,038

(22) Filed: May 19, 2022

(65) Prior Publication Data

US 2023/0377884 A1    Nov. 23, 2023

(51) Int. Cl.
*H01L 21/027* (2006.01)
(52) U.S. Cl.
CPC ...... *H01L 21/0272* (2013.01); *H01L 21/0275* (2013.01)
(58) Field of Classification Search
CPC ....... H01L 21/027–0279; G03F 7/0035; G03F 7/004–115; G03F 7/26–428
See application file for complete search history.

(56) References Cited

U.S. PATENT DOCUMENTS 5,114,834 A * 5/1992 Nachshon .............. B23Q 7/003
                                                        216/48
6,009,888 A * 1/2000 Ye ..................... H01L 21/31133
                                                        257/E21.255

FOREIGN PATENT DOCUMENTS

EP              943390 A2 *  9/1999  ............. B23K 26/06
WO      WO-9717164 A1 *  5/1997  ............. B23K 26/06

* cited by examiner

*Primary Examiner* — Andres Munoz
(74) *Attorney, Agent, or Firm* — Seed IP Law Group LLP

(57) ABSTRACT

A method of forming a semiconductor device includes removing a light-sensitive material from a workpiece utilizing polarized electromagnetic radiation and annealing features on the workpiece utilizing electromagnetic radiation polarized in a different direction than the polarized electromagnetic radiation utilized to remove the light-sensitive material. In some embodiments, the electromagnetic radiation used to anneal the features on the workpiece is not polarized. In some described embodiments, light-sensitive material removed from the workpiece is exhausted from the chamber in which the light-sensitive removal process is carried out before it can deposit on surfaces of the chamber.

20 Claims, 20 Drawing Sheets

INTEGRATED PHOTORESIST REMOVAL AND LASER ANNEALING

BACKGROUND

The market for semiconductor devices continues to follow the path of Moore's Law. Current device geometry will continue to shrink to meet future performance requirements. Engineering of doped junctions will focus on placement and movement of single atoms within a very small crystal lattice. Controlling placement of dopant atoms to within a few atomic radii is needed.

Placement of dopant atoms is controlled by processes of implanting dopants into source and drain regions of silicon substrates and then annealing the substrates. Dopants may be used to enhance electrical conductivity in a silicon matrix, to induce damage to a crystal structure, or to control diffusion between layers. During annealing, a substrate is typically heated to high temperatures so that various chemical and physical reactions can take place in multiple IC devices defined in the substrate. Annealing recreates a more crystalline structure from regions of the substrate that were previously made amorphous, and "activates" dopants by incorporating their atoms into the crystalline lattice of the substrate. Ordering the crystal lattice and activating dopants reduces resistivity of the doped regions. Thermal processes, such as annealing, involve directing a relatively large amount of thermal energy onto a substrate in a short amount of time, and thereafter rapidly cooling the substrate to terminate the thermal process.

Various scanning laser anneal techniques have been used to anneal the surface(s) of the substrate. In general, these techniques deliver a constant energy flux to a small region on the surface of the substrate while the substrate is translated, or scanned, relative to the energy delivered to the small region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
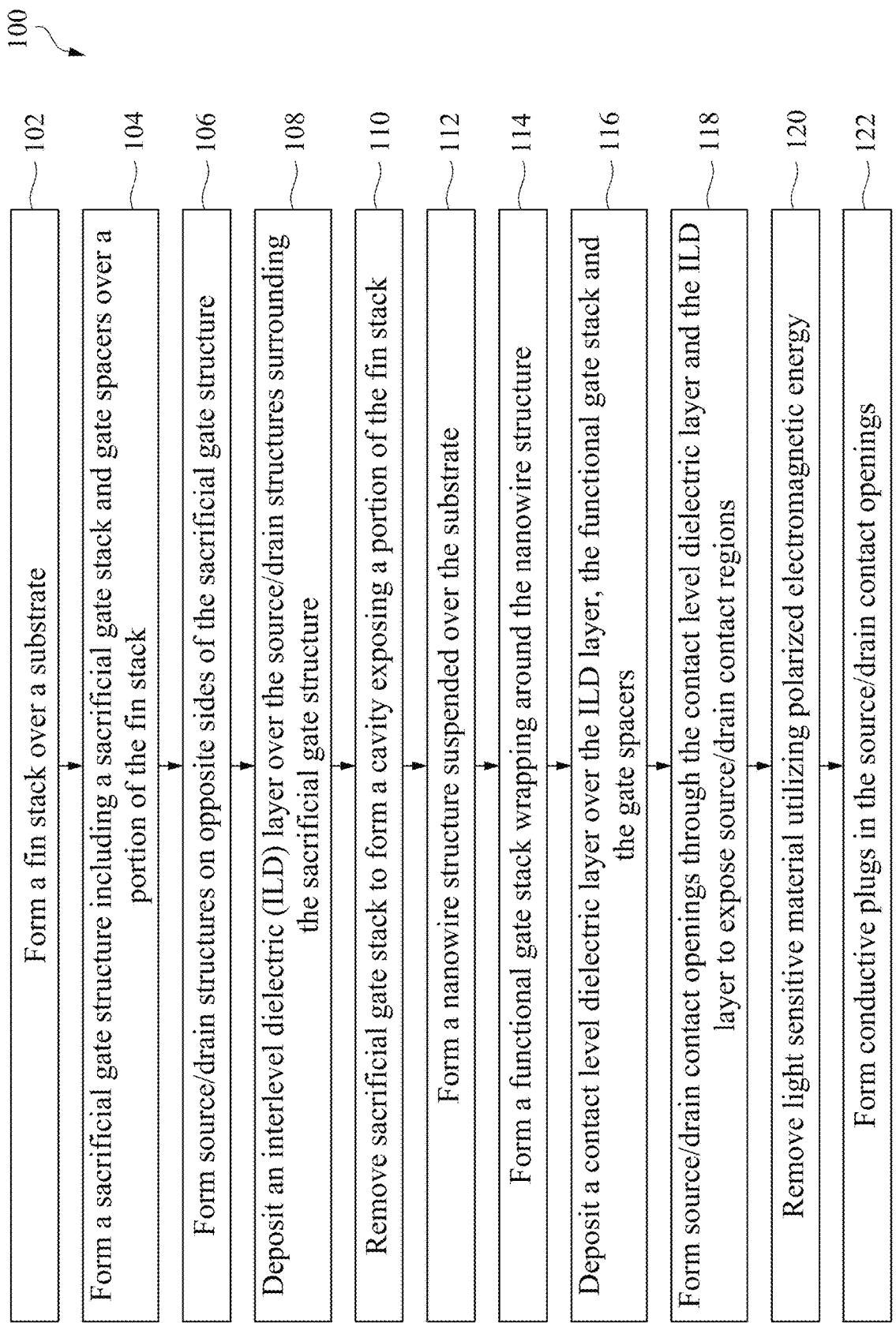
FIG. 1 is a flowchart of a method for fabricating a semiconductor FET device, in accordance with some embodiments.
Figure 1:
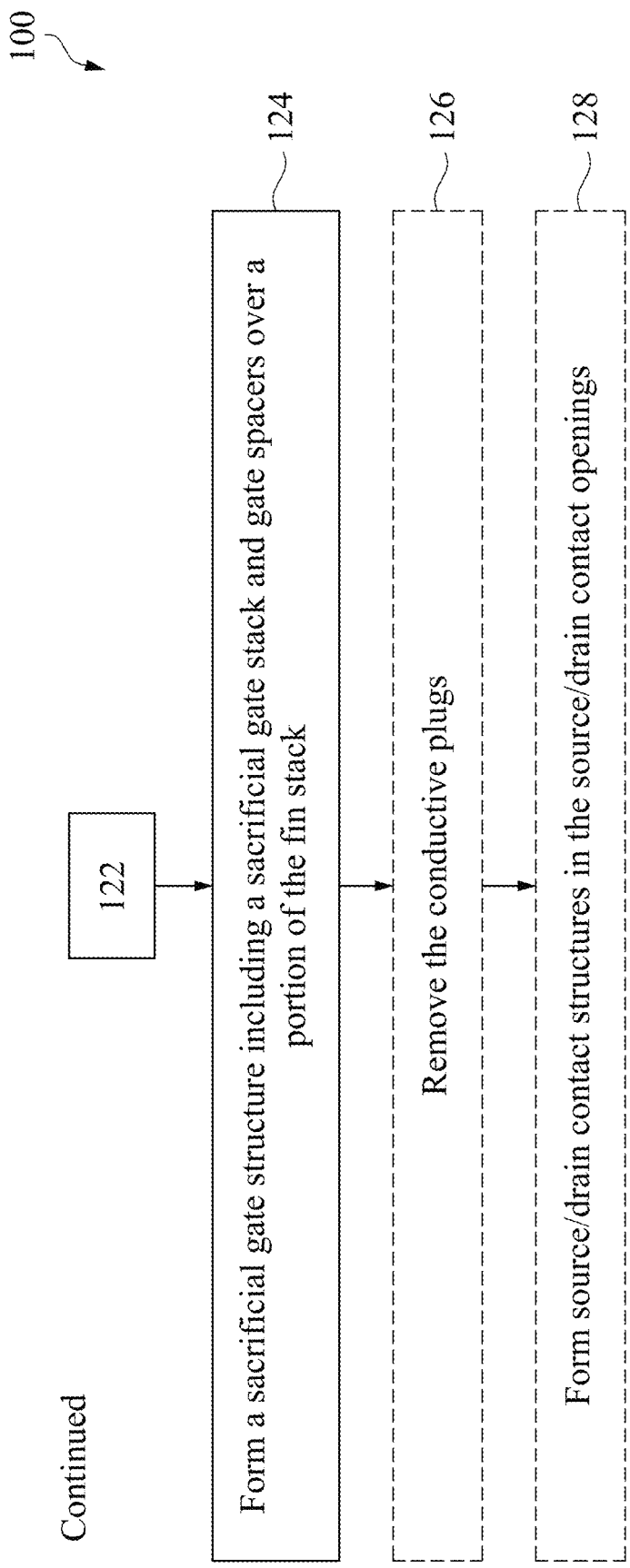

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments described herein relate to systems and methods for annealing portions of workpieces and removing light-sensitive materials, e.g., photoresists, from workpieces subjected to a heat treatment process in heat treatment equipment. The heat treatment equipment employs a source of electromagnetic energy, e.g., a laser, to heat structures on or within the workpiece. In accordance with embodiments of the present disclosure, electromagnetic energy is utilized to remove light-sensitive materials on the workpiece prior to carrying out a heat treatment process on portions of the workpiece. In another embodiment, electromagnetic energy utilized for removing light-sensitive materials from the workpiece is utilized in combination with other electromagnetic energy used to thermally anneal portions of the workpiece, for example, in the same tool or chamber. Embodiments in accordance with the present disclosure also provide methods and systems that reduce or prevent the light-sensitive material removed from the workpiece from depositing onto surfaces of the chamber in which the light-sensitive removal is carried out. The following description proceeds with reference to the manufacture and heat treatment of a field effect transistor (FET) that includes a fin structure; however, it should be understood that embodiments described herein are also applicable to the manufacture and processing of FETs or other semiconductor devices that do not include a fin structure.

In the manufacture of FETs, different conductive and non-conductive features are formed through a combination of deposition, lithography and/or material removal techniques. For example, a sacrificial gate material stack may be patterned by lithography, deposition and etching processes. Other examples of conductive features include source/drain features. In some embodiments, the term "source/drain" is referred to as a region that may be a source region or a drain region. Other examples of conductive or non-conductive structures that are formed using lithography, deposition and etching processes include source/drain contact openings, which can include openings for source contacts or openings for drain contacts and other contact openings, such as vias. Such features are typically formed by applying a photoresist layer over different layers of materials and then lithographically patterning the photoresist layer to form openings therein. The patterned photoresist resist layer is used as a mask to pattern the underlying material layers and is eventually removed to permit further processing. Examples of techniques to remove the unwanted photoresist include ashing the photoresist.

In a field effect transistor (FET) device, source/drain contacts are created by forming metal contacts on top of source/drain structures containing activated dopants such as phosphorous (P) or Arsenic (As) in the case of n-type FET devices and boron (B) in case of p-type FET devices. Thus, the contact resistance between the metal contacts and the source/drain structures, depends on the level of activated dopants in the source/drain contact regions proximate the metal/semiconductor interfaces. Dopants can be activated by a rapid thermal annealing process. Rapid thermal annealing elevates the temperature of the material including the dopants which facilitates movement of the dopants within the lattice structure of the material and repairs damage to the crystal structure of the material caused by the implantation of the dopants. Rapid thermal annealing can be carried out on a substrate level involving raising the temperature of the substrate or can be carried out on a local level by raising the temperature of localized areas of the substrate. Rapid thermal annealing can be used to accomplish other objectives such as changing film-to-film or film-to-substrate interfaces and densify deposited films, change states of grown films.

Prior to laser annealing a substrate or portions of a substrate, e.g., source drain contact regions including the dopants, light-sensitive material on the substrate that remains after exposing the source drain contact regions needs to be removed. For example, when laser annealing is to be used to activate dopants in a source/drain contact region, light-sensitive materials, e.g., photoresist, should be removed from around the contact openings for the source/drain contact regions. The light-sensitive material removed from the workpiece before the laser annealing process can collect on surfaces of the chamber in which the light-sensitive material removal and laser annealing is to be carried out. When the light-sensitive material collects on surfaces through which the laser used in the annealing process must pass, the collected light-sensitive material can block portions of the laser from heating portions of the workpiece. Such collected light-sensitive material can be removed from such surfaces by manual wiping; however, this contributes to the downtime of the tool which is undesirable. If such light-sensitive materials are not removed before attempting to laser anneal the source drain contact regions, the temperature of the source drain contact regions containing the dopants may not be elevated sufficiently, thus, rendering the laser annealing process ineffective or less effective.

One technique for removing such light-sensitive materials from the workpiece utilizes a plasma to ash the light-sensitive material. In a plasma process, ions and radicals generated by the plasma source, e.g., oxygen and/or fluorine radicals, combine with the light-sensitive material to form an ash. While such technique has been effective to remove light-sensitive materials from workpieces, it suffers from the potential drawback of damage to the surface of the workpiece by oxidation of certain species by the plasma. In addition, the ashed light-sensitive materials may collect on surfaces of the chamber where they can negatively affect subsequent processes, e.g., the laser annealing of the workpiece.

In accordance with embodiments of the present disclosure, a source of electromagnetic energy, such as a laser, is utilized to remove light-sensitive materials on a substrate upon which the laser annealing process is to be carried out. When the electromagnetic energy used to remove such light-sensitive materials exceeds the desired thermal budget, melting of the semiconductor channel or other nearby structures can occur, especially when the semiconductor channel has a small dimension in case of nanowire, nanosheet, or nanobar containing structures. The melting of the semiconductor channel is detrimental to the device performance and reliability. When the electromagnetic energy exceeds the thermal budget, it can also raise the temperature of the metal gate formed by the gate-last scheme to undesirable levels, which can adversely affect the integrity of the metal gate. When the electromagnetic energy exceeds the thermal budget, it can also deactivate activated dopants in source/drain contact regions. Accordingly, in some embodiments of the present disclosure, the electromagnetic energy used to remove the light-sensitive material is polarized. Polarizing the electromagnetic energy used to remove the light-sensitive material reduces the thermal energy produced during the removal of the light-sensitive material and reduces the likelihood that the thermal budget will be exceeded, thus, reducing the likelihood of damage to the semiconductor channel or other nearby structures. In some embodiments, the electromagnetic energy used to anneal portions of the substrate is also polarized, albeit differently than the electromagnetic energy utilized in the light-sensitive material removal process. In some embodiments, the electromagnetic energy used to remove the light-sensitive material is generated by an electromagnetic energy source that is different from the source of electromagnetic energy use to anneal portions of the substrate and the light-sensitive material removal step and the anneal step are carried out in separate chambers. In other embodiments, the light-sensitive material removal step and the anneal step are carried out in the same process chamber. In some embodiments, the process of removing the light-sensitive materials from the substrate includes exhausting the ashed light-sensitive material from the chamber in which the removal process is carried out. Exhausting the ashed light-sensitive material from the chamber reduces or prevents the ashed light-sensitive material from collecting on surfaces of the process chamber, e.g., surfaces through which the electromagnetic energy used in the annealing process must pass.

The present disclosure provides methods that allow preventing thermal damage to structures on a substrate, e.g., a gate and semiconductor channel during removal of a light-sensitive material from the substrate prior to carrying out a laser annealing process, e.g., during a dopant activating process, while maintaining high dopant activation efficiency. In accordance with the specific embodiment of the present disclosure described below in the context of an FET with a fin, after forming conductive plugs which have high thermal conductivity in the source/drain contact openings to contact source/drain contact regions of a semiconductor FET device, a laser irradiation, in accordance with embodiments of the present disclosure is carried out, to remove light-sensitive material on the substrate. During the process of removing the light-sensitive material from the substrate, the removed light-sensitive material is removed from the chamber in which the removal process is carried out. Thereafter, a laser anneal is carried out to activate dopants in the source/drain contact regions. The removal of the light-sensitive material is carried out under conditions that prevent the gate and semiconductor channel from being thermally damaged by the laser irradiation. In the meanwhile, the conductive plugs function as local heat conductors to dissipate heat to the underlying source/drain contact regions, which helps to facilitate the dopant activation. The conductive plugs help to confine heat to the source/drain contact regions to achieve improved local dopant activation efficiency without heating other areas, thus, avoiding unwanted dopant diffusion and degradation of the gate and semiconductor channel. As a result, reliability of the semiconductor device is increased.

In the present disclosure, nanostructure (e.g., nanowire, nanosheet, or nanobar) FET devices and the method of forming the same are provided in accordance with various embodiments. The intermediate stages of forming the nanostructure FET devices are illustrated. The variations and the operations of the nanostructure FET devices in accordance with embodiments are discussed. Throughout the various views and illustrative embodiments, like reference numbers are used to designate like elements. Although embodiments described herein are described in the context of nanostructure FET devices, implementations of some embodiments of the present disclosure are usable in other processes and/or in other devices, such as planar FET devices or fin FET devices.

Figure 2A:
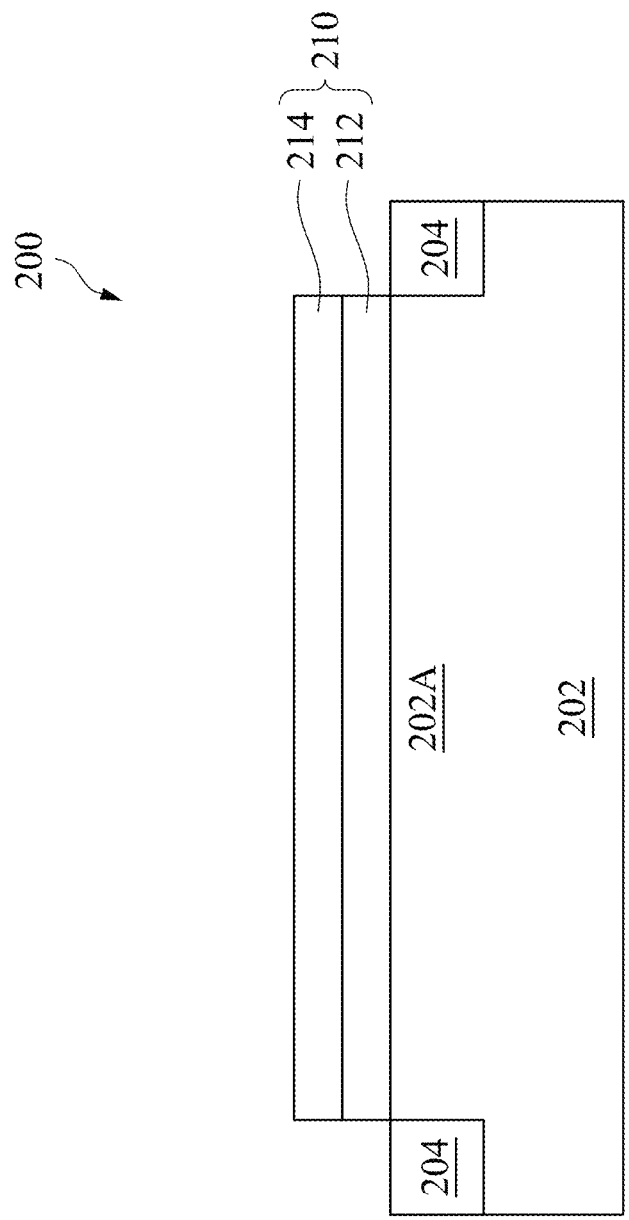
FIGS. 2A-2M are cross-sectional views of a semiconductor FET device at various stages of the fabrication process, in accordance with some embodiments.
Figure 2B:
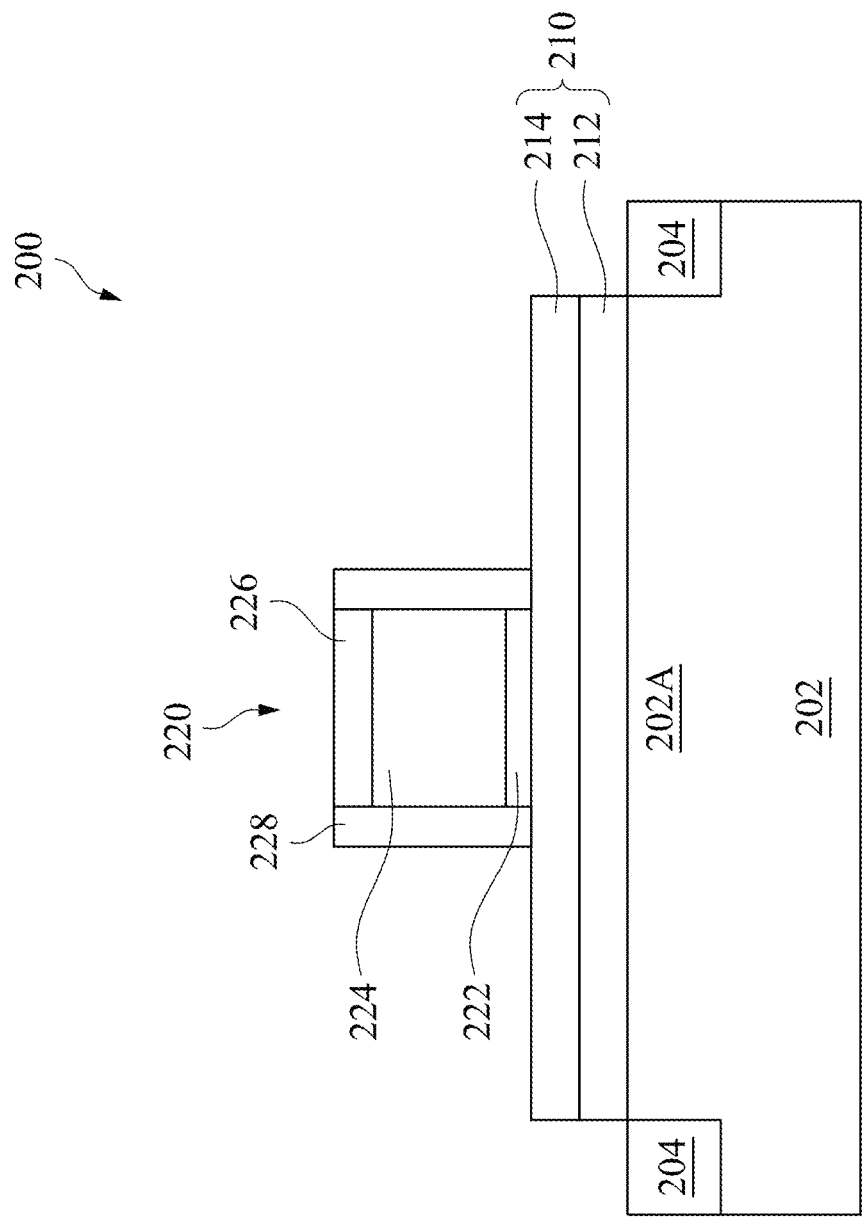
Figure 2C:
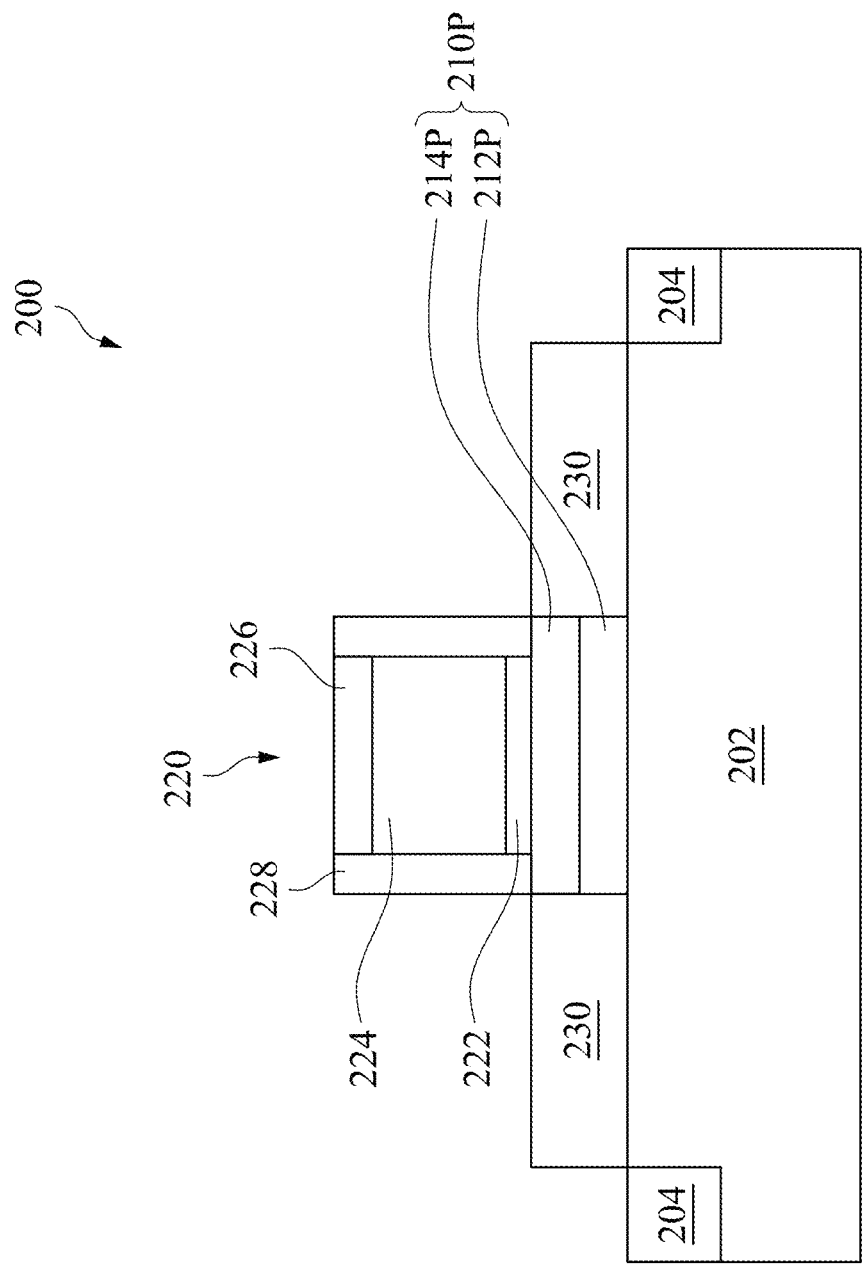
Figure 2D:
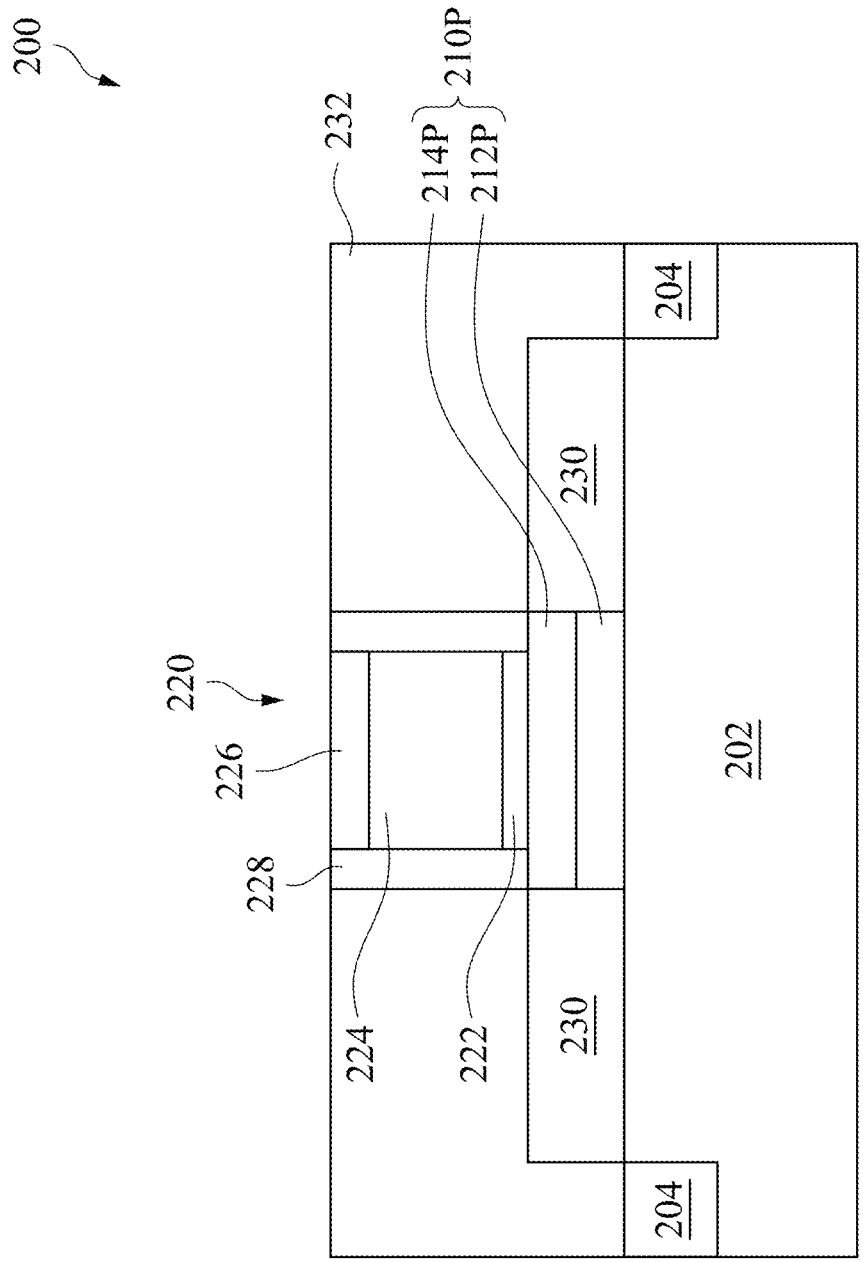
Figure 2E:
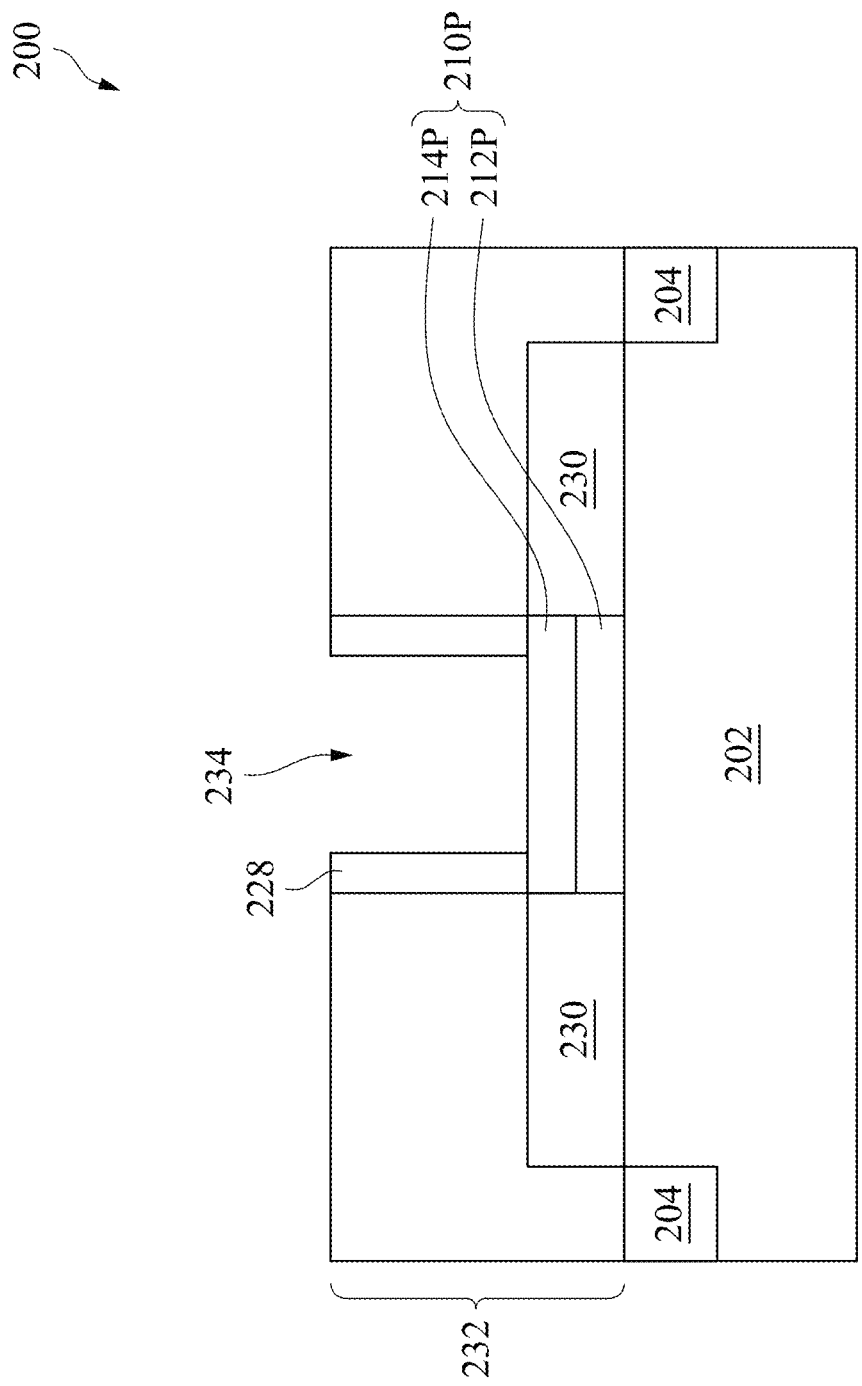
Figure 2F:
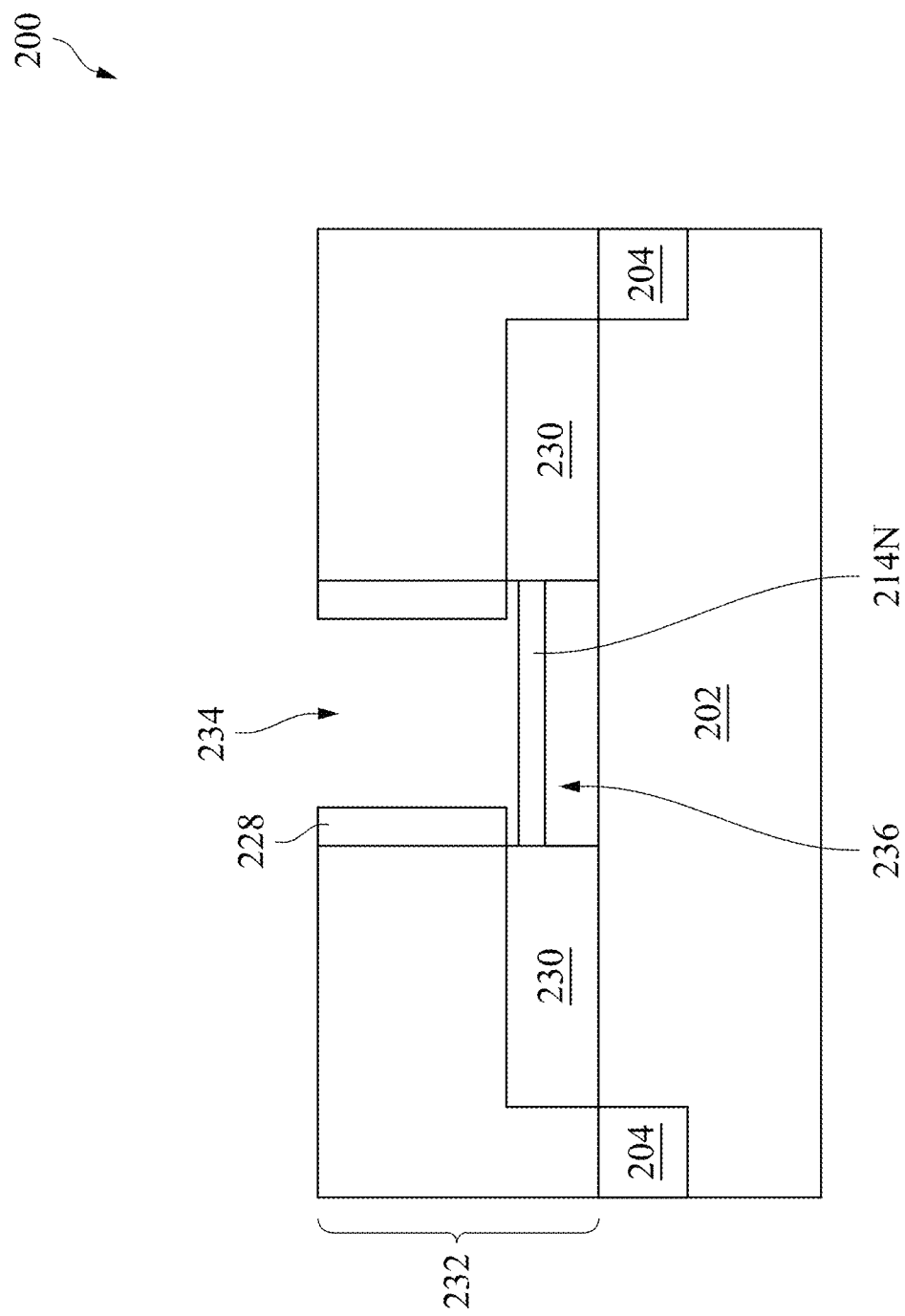
Figure 2G:
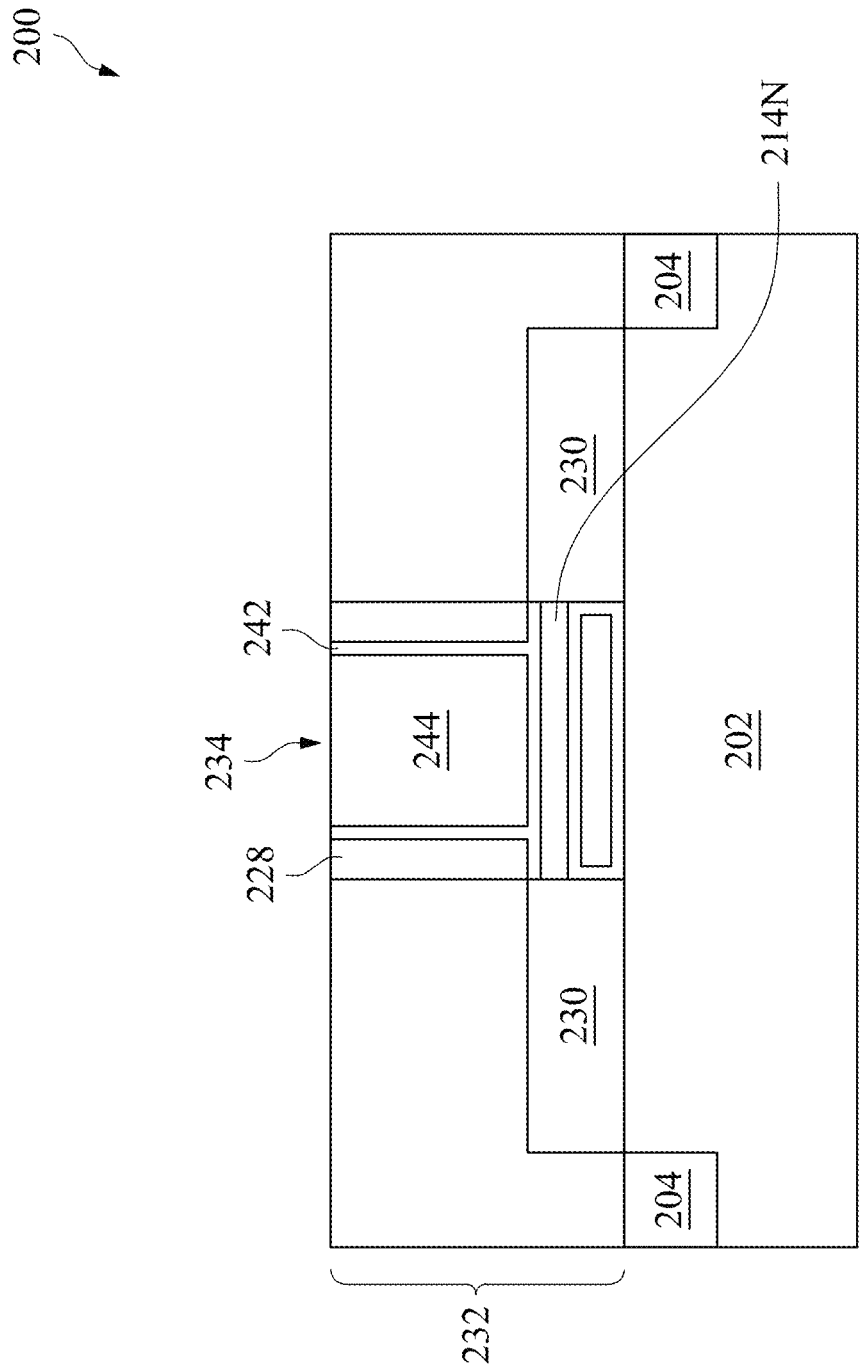
Figure 2H:
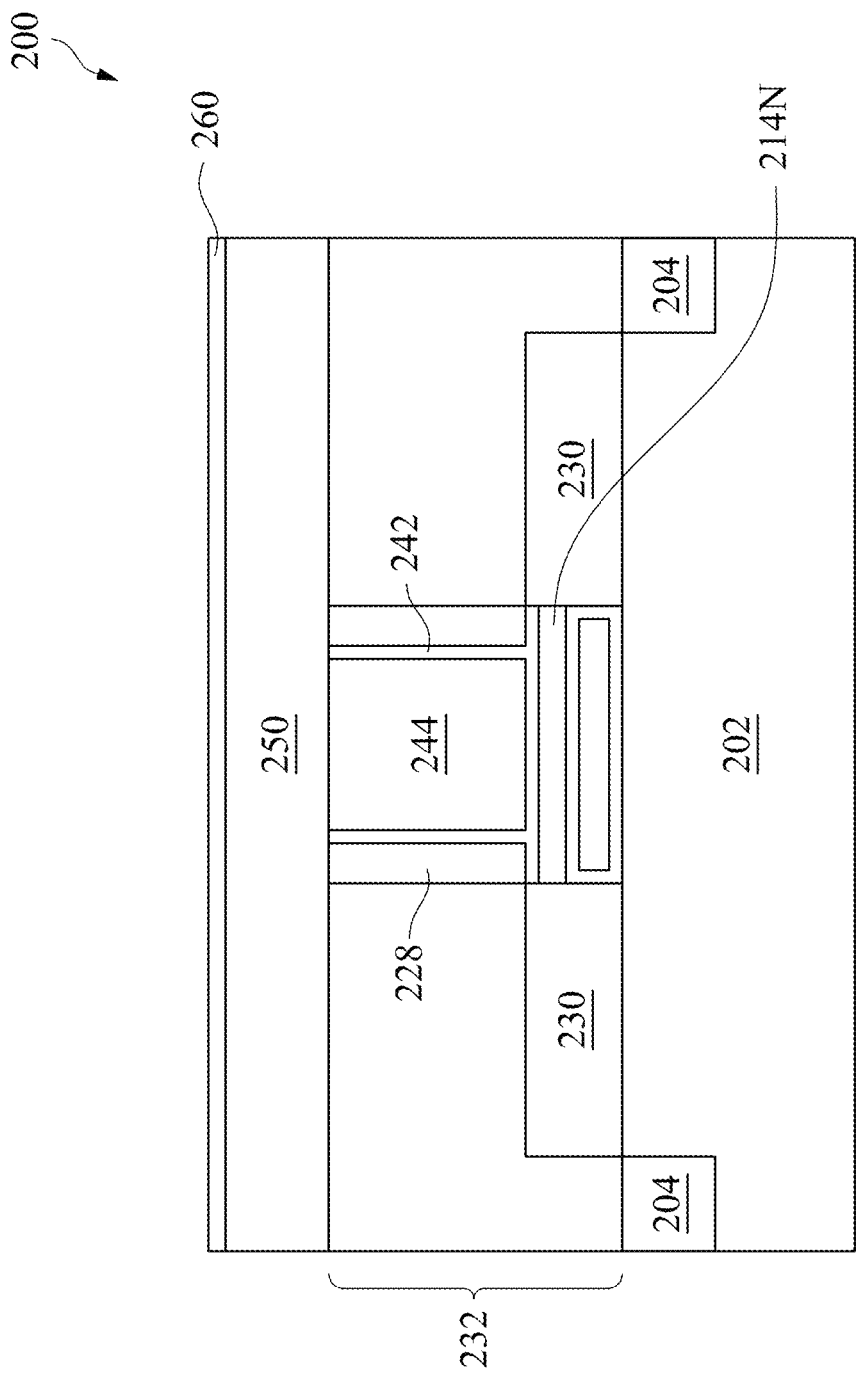
Figure 2I:
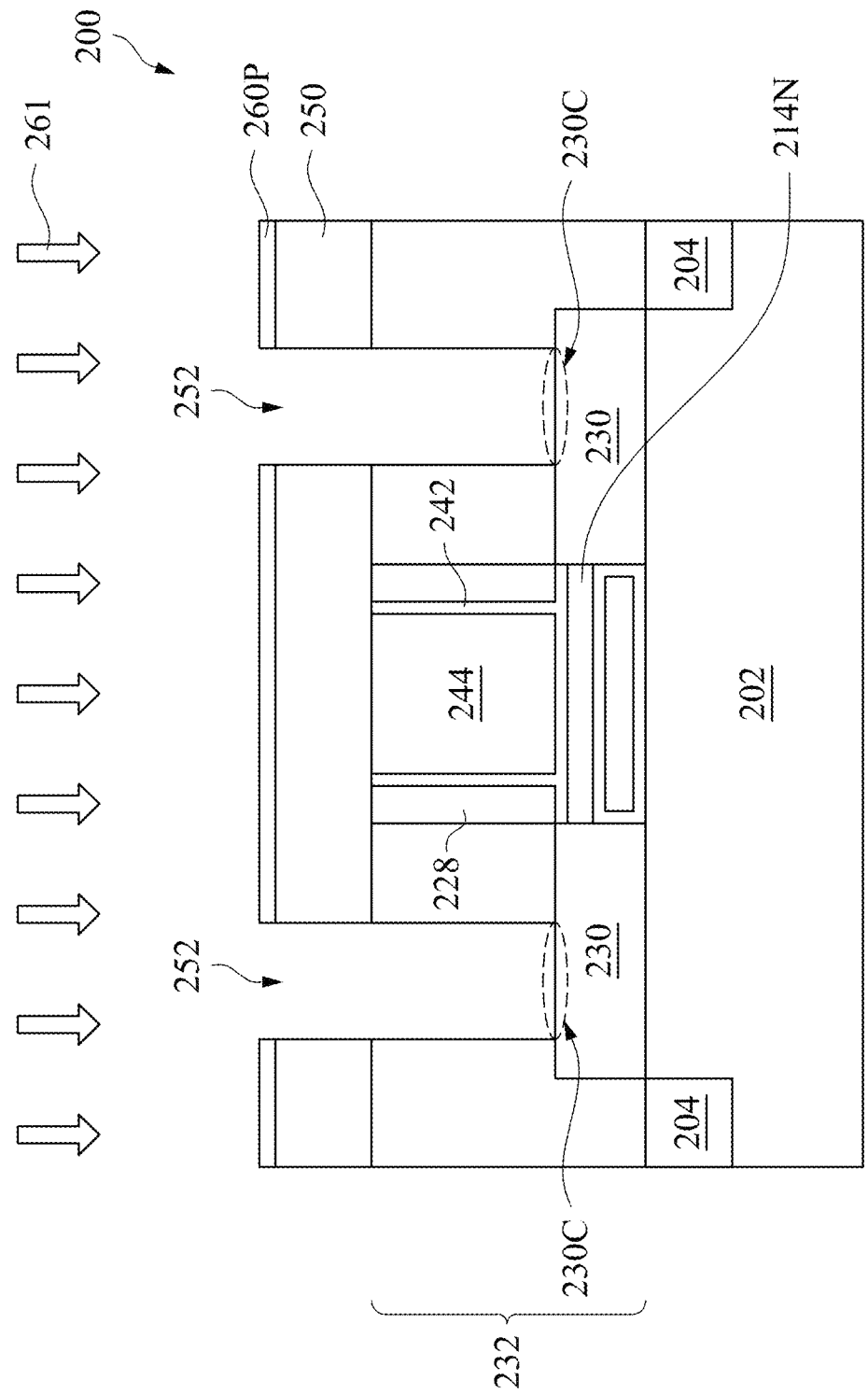
Figure 2J:
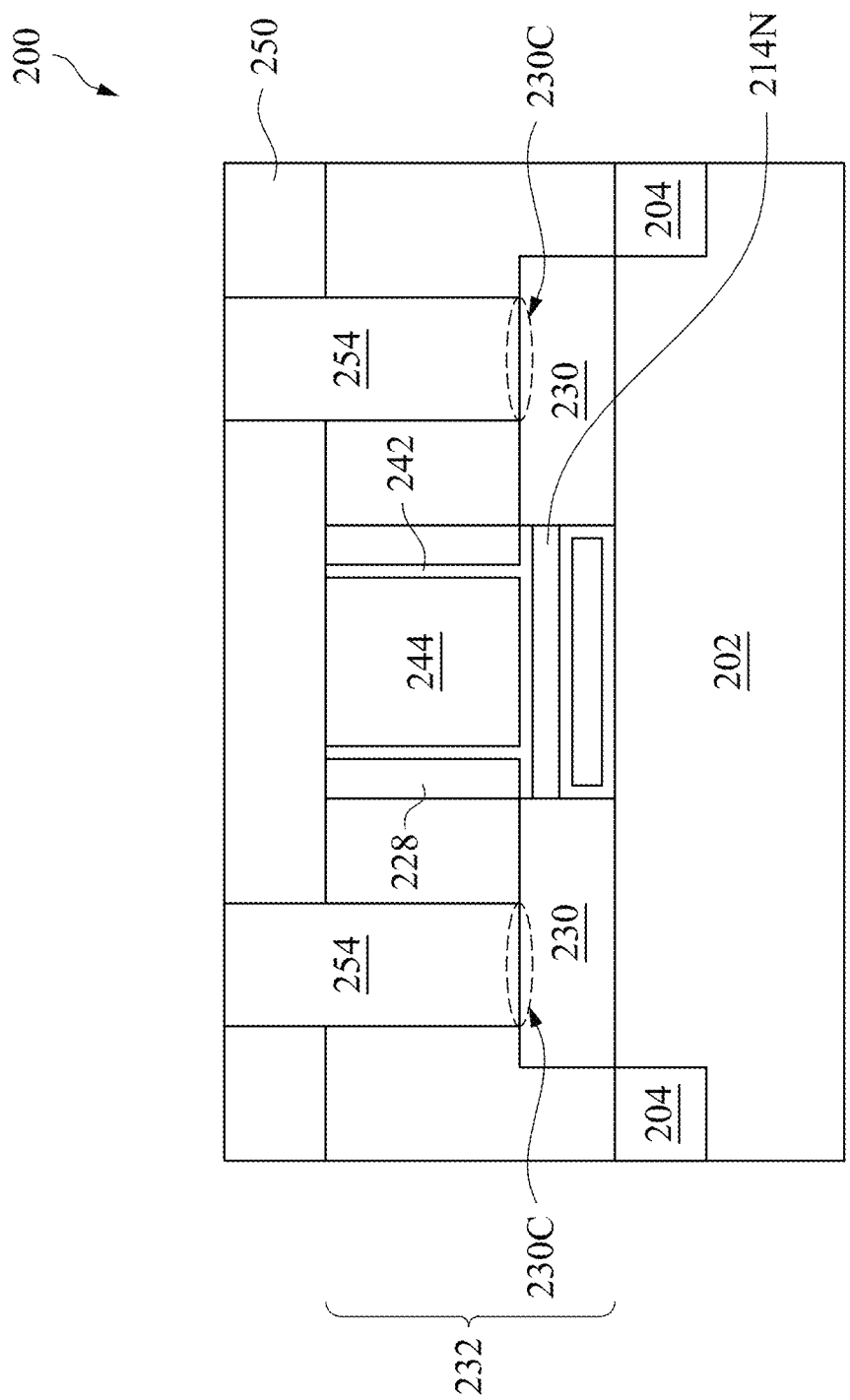
Figure 2K:
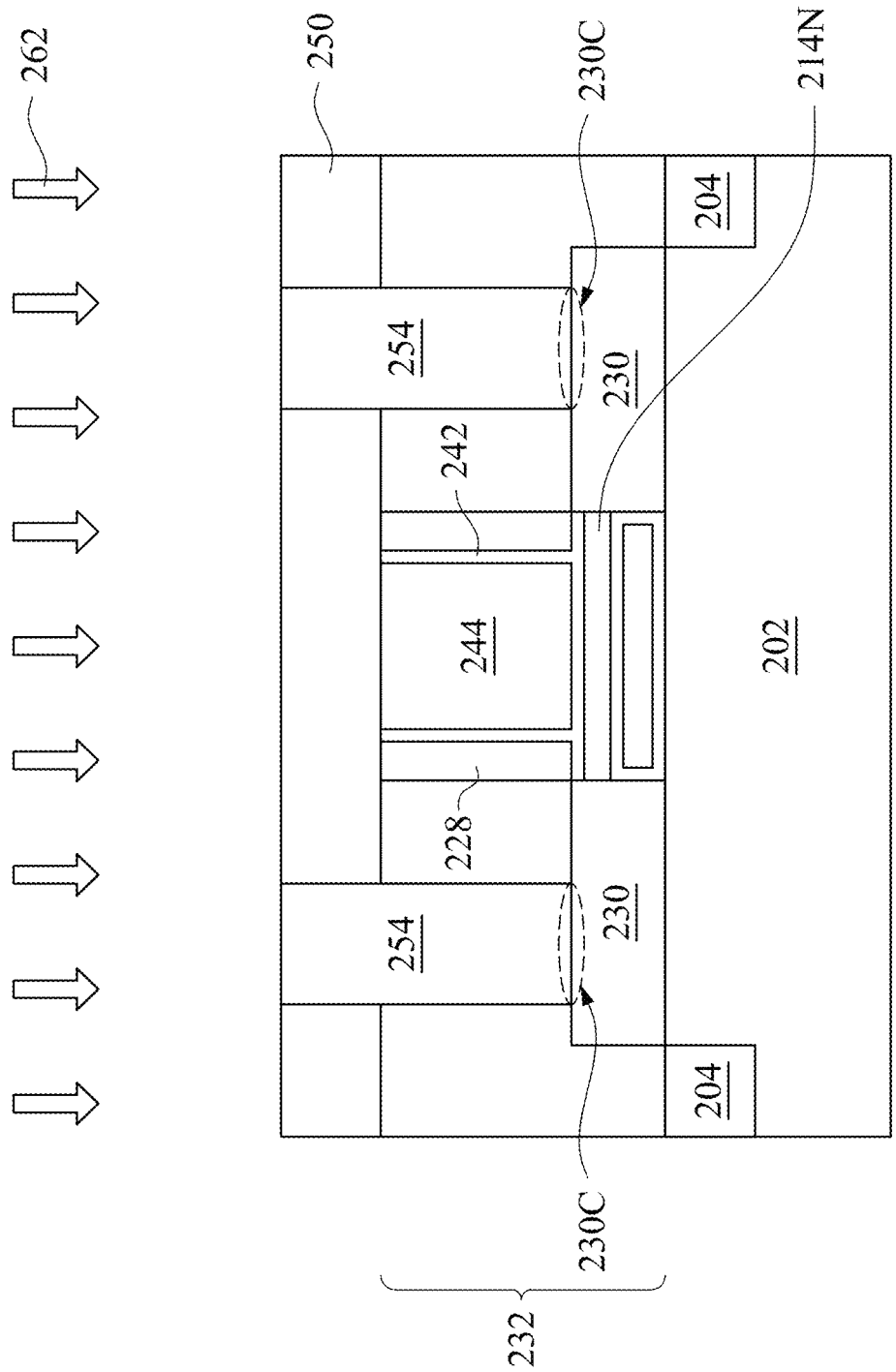
Figure 2L:
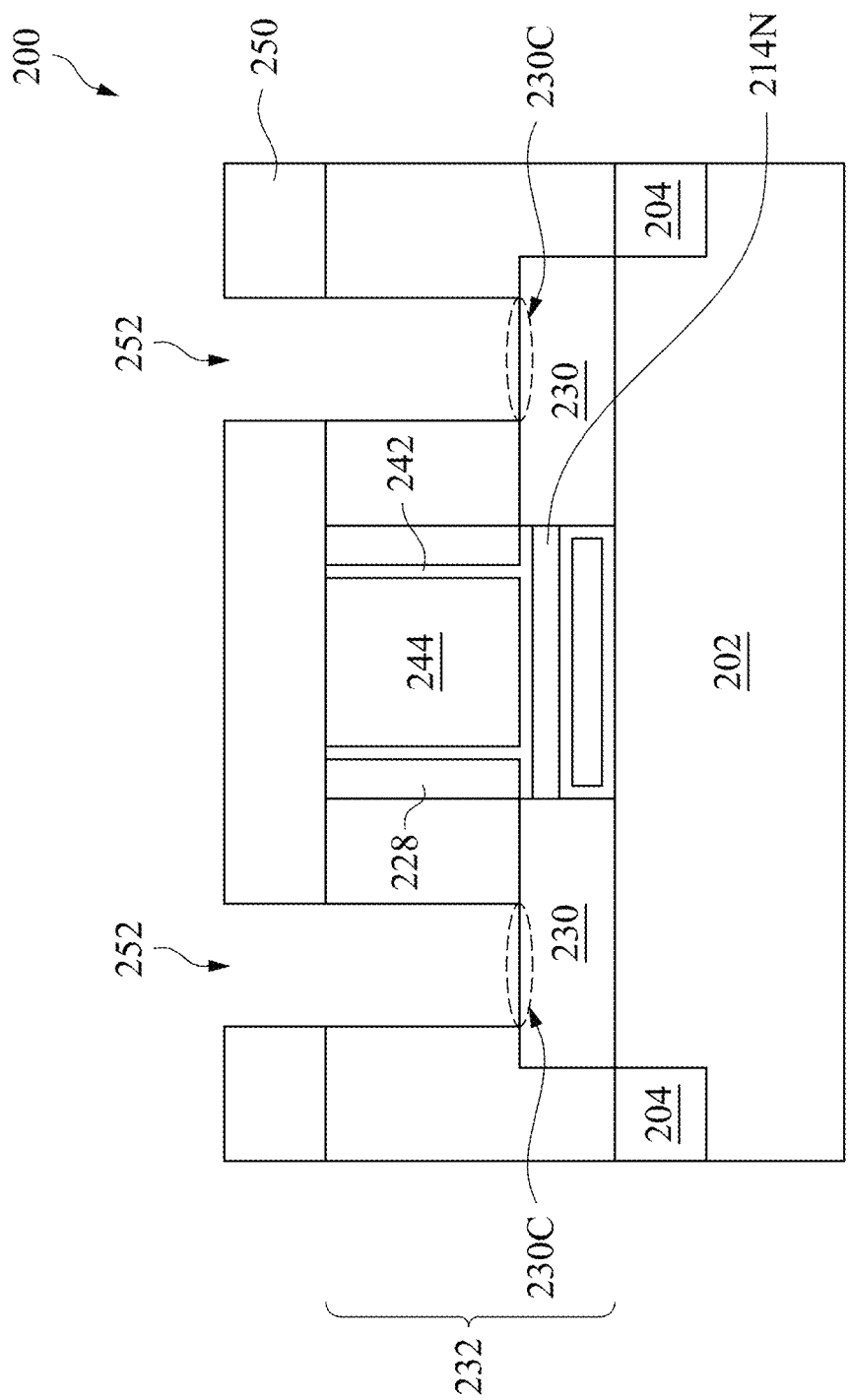
Figure 2M:
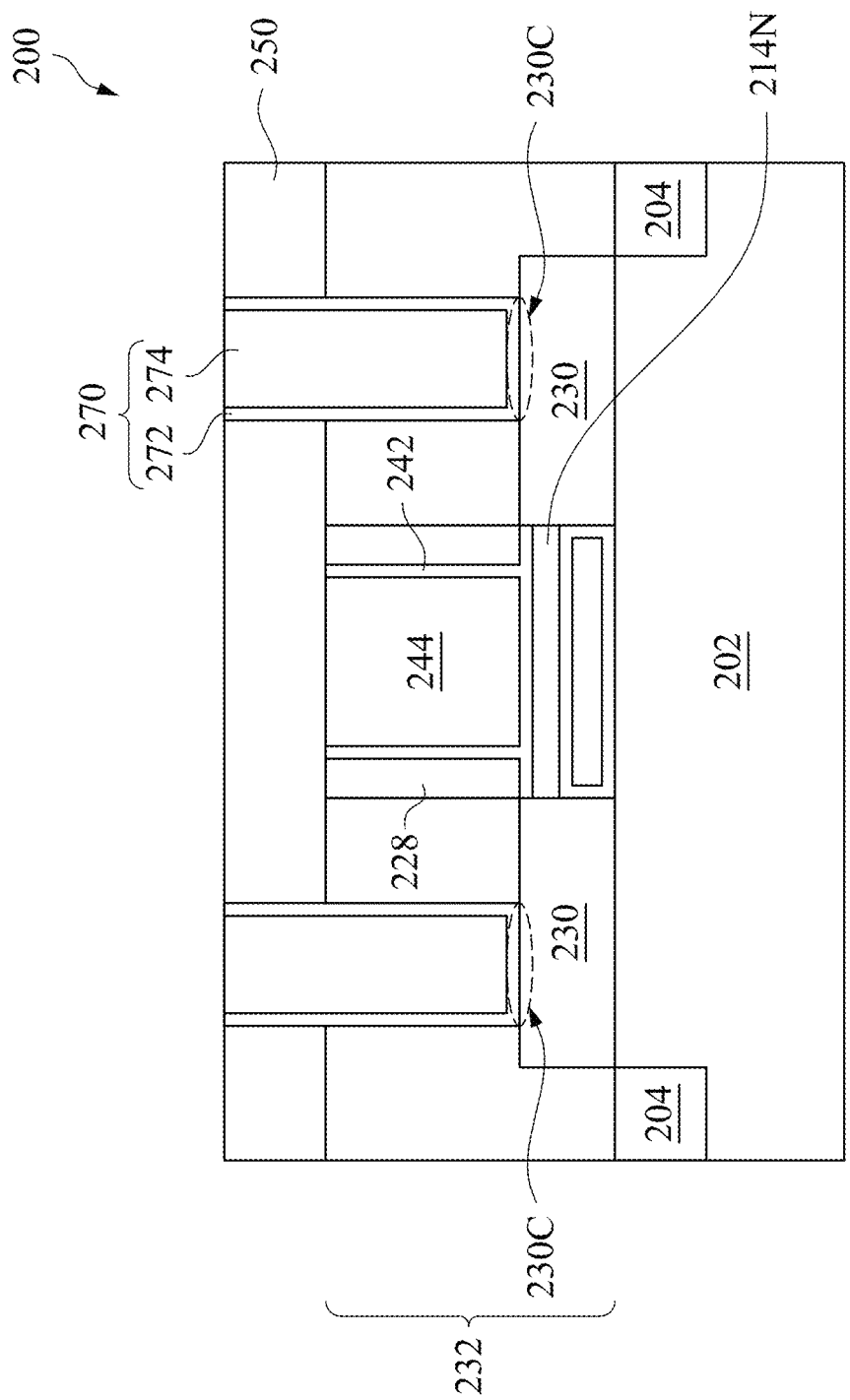

FIG. 1 is a flowchart of a method 100 for fabricating a semiconductor FET device 200, as shown in FIG. 2M, in accordance with some embodiments. FIGS. 2A through 2M are cross-sectional views of the semiconductor FET device 200 at various stages of the fabrication process, in accordance with some embodiments. The method 100 is discussed in detail below, with reference to the semiconductor FET device 200. The flowchart illustrates only a relevant part of the entire manufacturing process for the semiconductor FET device 200. It is understood that additional operations may be provided before, during, and after the operations shown by FIG. 1, and some of the operations described below can be replaced or eliminated for additional embodiments of the method. The order of the operations/processes may be interchangeable.

Figure 7:
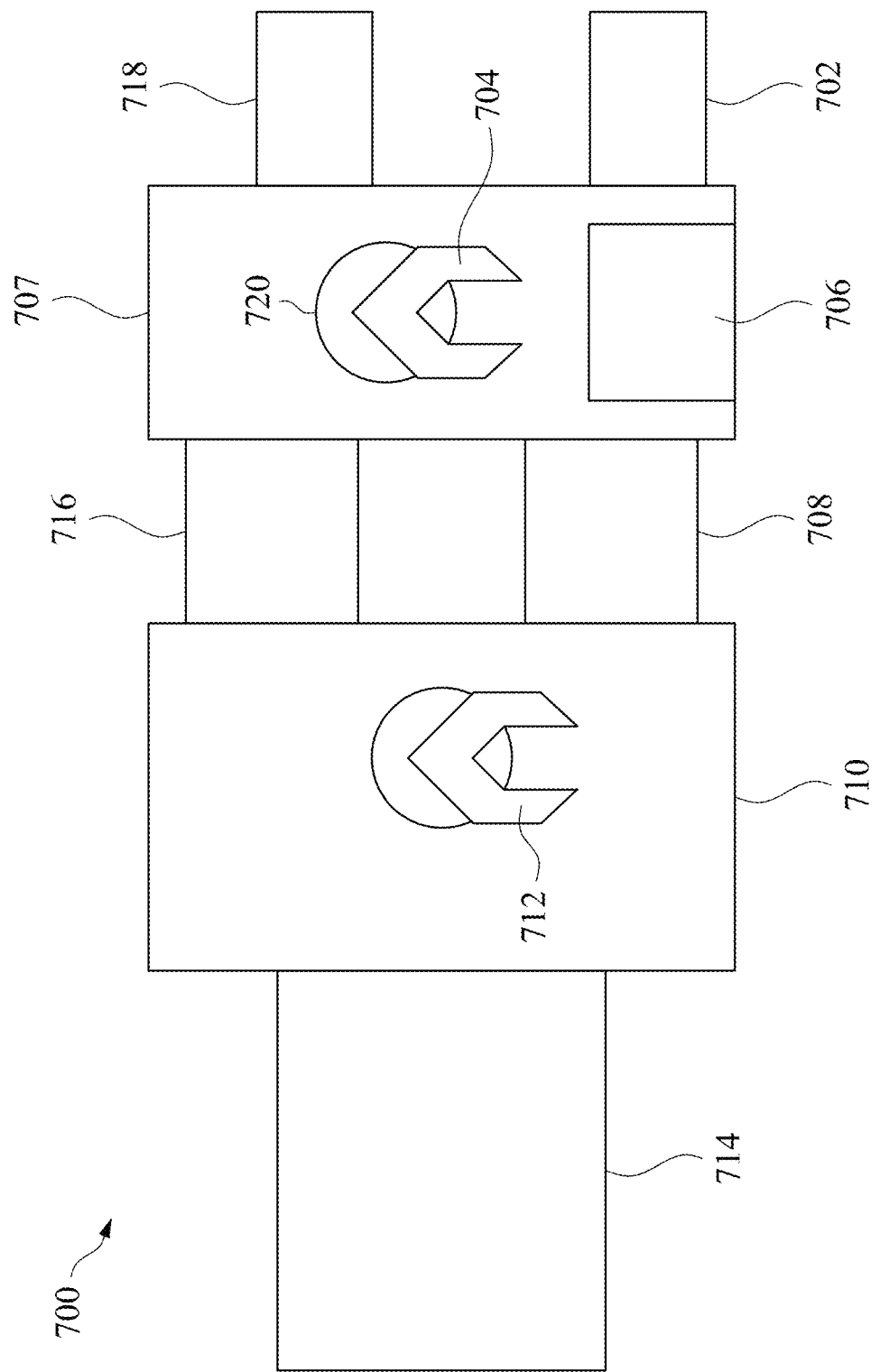
FIG. 7 is a schematic illustration of tool useful in accordance with embodiments of the present disclosure.

Some of the operations of method 100 illustrated in FIG. 1 can be carried out in a tool 700 illustrated in FIG. 7. For example, annealing a workpiece 720 in accordance with method 100, can be carried out in tool 700. Tool 700 includes an input load port 702, a robot 704, an aligner 706, a chamber 707 including aligner 706 and robot 704, a load lock 708, a chamber 710 including a second robot 712, a process chamber 714, a second load lock 716 and an output load port 718. In tool 700, workpiece 720 is received from input load port 702 into a chamber 707 that includes robot 704 and aligner 706. Robot 704 transfers workpiece 720 to load lock 708 between chamber 707 and chamber 710 including second robot 712. Robot 712 transfers workpiece 720 from chamber 710 into process chamber 714 where low pressure annealing is carried out. Once the low temperature annealing is completed in chamber 714, robot 712 transfers workpiece 720 from chamber 714 to load lock 716, where robot 704 receives workpiece 720 and transfers it to load port 718.

Referring to FIG. 1, at operation 102 of method 100, a fin structure 210 is fabricated over a substrate 202, as shown in FIG. 2A. The fin structure 210 is formed over the substrate 202 and protrudes from isolation structures 204.

In some embodiments, the substrate 202 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as, for example, silicon (Si), germanium (Ge), silicon germanium (SiGe), carbon doped silicon (Si:C), silicon germanium carbon (SiGeC); or an III-V compound semiconductor such as, for example, gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as, for example, single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the substrate 202, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the substrate 202 is a semiconductor-on-insulator (SOI) substrate including a top semiconductor layer formed on an insulator layer (not shown). The top semiconductor layer includes the above-mentioned semiconductor material such as, for example, Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

The fin structure 210 includes alternatively stacked first semiconductor strips 212 and second semiconductor strips 214. In some embodiments and as in FIG. 2A, the fin structure 210 includes a first semiconductor strip 212 and a second semiconductor strip 214 stacked over the first semiconductor strip 212. Although FIG. 2A illustrates a fin structure 210 comprising a single first semiconductor strip 212 and a single second semiconductor strip 214, the fin structure 210 of the present disclosure is not limited to such number of first semiconductor strips 212 and second semiconductor strips 214. Instead, the fin structure 210 of the present disclosure can include any number of second semiconductor strips 214 separated from one another by first semiconductor strips 212. Furthermore, although a single fin structure 210 is illustrated in FIG. 2A, multiple fin structures are contemplated in the present disclosure.

In some embodiments, the first semiconductor strip 212 includes a sacrificial semiconductor material that can be removed selective to a semiconductor material that provides the second semiconductor strip 214. For example, in some embodiments, the first semiconductor strip 212 includes SiGe, and the second semiconductor strip 214 includes Ge. In other embodiments, the first semiconductor strip 212 includes SiGe, and the second semiconductor strip 214 includes Si. In still other embodiments, the first semiconductor strip 212 and the second semiconductor strip 214 includes SiGe with different Ge concentrations.

The fin structure 210 is formed by patterning a material stack (not shown) that includes alternatively stacked first semiconductor material layers and second semiconductor material layers. Each of the first semiconductor material layers and the second semiconductor material layers in the material stack is formed by depositing an appropriate material using an epitaxial growth process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of a semiconductor material with sufficient energy to move around on the surface and orient themselves to the crystal arrangement of the atoms of the deposition surface. Therefore, an epitaxial semiconductor material that is formed by an epitaxial deposition process has the same crystalline characteristics as the deposition surface on which it is formed. For example, an epitaxial semiconductor material deposited on a {100} crystal surface will take on a {100} orientation. Thus, each layer in the material stack has an epitaxial relationship, i.e., same crystal orientation, as that of the underlying substrate 202. Examples of various epitaxial growth processes that are suitable for use in forming layers in the material stack include, e.g., rapid thermal chemical vapor deposition (RT-CVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). In some embodiments, the epitaxial growth of the various layers in material stack is performed without breaking vacuum between the various depositions. In some embodiments, the vacuum is broken between any of the various depositions.

In some embodiments, the patterning of the material stack is performed by first applying a mask layer over a topmost surface of the material stack and lithographically patterning the mask layer to provide a patterned mask layer that covers one or more areas where the fin structure(s) 210 are to be formed. In some embodiments, the mask layer is a photoresist layer or a photoresist layer in conjunction with a hardmask layer(s). The material stack is then etched by an anisotropic etch using the patterned mask layer as an etch mask. In some embodiments, the anisotropic etch is a dry etch such as, for example, reactive ion etch (RIE), a wet etch, or a combination thereof. In some embodiments, the etch stops at approximately the surface of the substrate 202. In some embodiments, the etch proceeds into the substrate 202. Thus, a raised substrate portion 202A is formed beneath the first semiconductor strip 212 of the fin structure 210. After formation of the fin structure(s) 210, the patterned mask layer is removed, for example, by oxygen plasma. Alternatively, in some embodiments, other methods, such as sidewall image transfer (SIT) or directional self-assembly (DSA), are used to pattern the material stack to provide the fin structure(s) 210.

After forming the fin structure 210, isolation structures 204 are formed surrounding the raised substrate portion 202A such that the fin structure 210 protrudes above the isolation structures 204. In some embodiments, the isolation structures 204 are shallow trench isolation structures formed in the substrate 202. In some embodiments, the isolation structures 204 include silicon oxide, silicon nitride, silicon oxynitride, and/or other suitable insulating material. In some embodiments, the isolation structures 204 include a multilayer structure, for example, having one or more thermal oxide liner layers disposed on the bottom portion of the raised substrate portion 202A. In some embodiments, the isolation structures 204 are formed by etching trenches in the substrate and filling trenches with an insulating material using suitable deposition processes. In some embodiments, the deposition of the insulating material is performed, for example, by chemical vapor deposition (CVD), plasma enhance chemical vapor deposition (PECVD), or spin coating. In some embodiments, the isolation structures 204 include silicon oxide formed by a flowable CVD process (FCVD) during which a flowable oxide is deposited and a post-deposition anneal is then performed to convert the flowable oxide into silicon oxide. Excess deposited insulating material is subsequently removed from above the topmost surface of the fin structure 210, for example, by a chemical mechanical planarization (CMP) process. After planarization, the top surfaces of the deposited insulating material are coplanar with the topmost surface of the fin structure 210. Next, the deposited insulating material is recessed to provide the isolation structures 204.

Referring to FIG. 1, at operation 104 of method 100, a sacrificial gate structure 220 is formed over the fin structure 210, as shown in FIG. 2B. The sacrificial gate structure 220 includes a sacrificial gate stack 222, 224, 226 straddling a portion of the fin structure 210 and gate spacers 228 on sidewalls of the sacrificial gate stack 222, 224, 226. By "straddling" it is meant that a sacrificial gate stack is formed atop and along sidewalls of the fin structure 210. The term "sacrificial gate stack" as used herein refers to a placeholder structure for a subsequently formed functional gate stack. The term "functional gate stack" as used herein refers to a permanent gate stack used to control output current (i.e., flow of carriers in the channel) of a semiconducting device through electrical fields or magnetic fields. It should be noted that although a single sacrificial gate structure is described and illustrated, multiple sacrificial gate structures are contemplated in the present disclosure.

The sacrificial gate stack 222, 224, 226 includes, from bottom to top, a sacrificial gate dielectric 222, a sacrificial gate conductor 224, and a sacrificial gate cap 226. In some embodiments, the sacrificial gate dielectric 222 is omitted. In some embodiments, the sacrificial gate stack 222, 224, 226 is formed by first providing a sacrificial material stack (not shown) that includes, from bottom to top, a sacrificial gate dielectric layer if the sacrificial gate dielectric 222 is present, a sacrificial gate conductor layer and a sacrificial gate cap layer, over the fin structure 210 and the substrate 202, and by subsequently patterning the sacrificial material stack.

If present, in some embodiments, the sacrificial gate dielectric layer includes silicon oxide, silicon nitride, or silicon oxynitride. In some embodiments, the sacrificial gate dielectric layer is formed utilizing a deposition process such as, for example, CVD or physical vapor deposition (PVD). In some embodiments, the sacrificial gate dielectric layer is formed by conversion of a surface portion of the fin structure 210 utilizing thermal oxidation or nitridation.

In some embodiments, the sacrificial gate conductor layer includes polysilicon. In some embodiments, the sacrificial gate conductor layer is formed utilizing a deposition process such as, for example, CVD or PECVD.

In some embodiments, the sacrificial gate cap layer includes a dielectric material such as an oxide, a nitride, or an oxynitride. For example, in some embodiments, the sacrificial gate cap layer includes silicon nitride. In some embodiments, the sacrificial gate cap layer is formed utilizing a deposition process such as, for example, CVD or PECVD.

In some embodiments, the sacrificial gate material stack is patterned by lithography and etching. For example, a photoresist layer (not shown) is applied over the topmost surface of the sacrificial material stack and lithographically patterned by lithographic exposure and development. The pattern in the photoresist layer is sequentially transferred into the sacrificial material stack by at least one anisotropic etch. The anisotropic etch is a dry etch, for example RIE, a wet etch, or a combination thereof. If not completely consumed, the remaining photoresist layer after formation of the sacrificial gate stack is removed by, for example, ashing.

In some embodiments, the gate spacers 228 include a dielectric material such as, for example, an oxide, a nitride, an oxynitride, or combinations thereof. In some embodiments, the gate spacers 228 comprise silicon nitride. In some embodiments, the gate spacers 228 are formed by first depositing a conformal gate spacer material layer (not shown) on exposed surfaces of the sacrificial gate stack 222, 224, 226, the fin structure 210 and the substrate 202 and then etching the gate spacer material layer to remove horizontal portions of the gate spacer material layer. In some embodiments, the gate spacer material layer is deposited, for example, by CVD, PECVD, or atomic layer deposition (ALD). In some embodiments, the gate spacer material layer is etched by dry etch such as, for example, RIE. Vertical portions of the gate spacer material layer present on the sidewalls of sacrificial gate stack 222, 224, 226 constitute the gate spacers 228.

Referring to FIG. 1, at operation 106 of method 100, a source structure and a drain structure (collectively referred to as source/drain structures 230) are formed on opposite sides of the sacrificial gate structure 220, as shown in FIG. 2C. The source/drain structures 230 are highly doped semiconductor regions with a dopant concentration from about $1 \times 10^{19}$ atoms/cm$^3$ to about $2 \times 10^{21}$ atoms/cm$^3$, although lesser or greater dopant concentrations are also contemplated.

In some embodiments, the source/drain structures 230 are formed by implanting dopants into portions of the fin structure 210 that are not covered by the sacrificial gate structure 220. In some embodiments and when the resulting semiconductor FET device 200 is an n-type FET device, n-type dopants such as phosphorus or arsenic are doped in the source/drain structures 230. In some other embodiments and when the resulting semiconductor FET device 200 is a p-type FET device, p-type dopants such as boron or BF$_2$ are doped in the source/drain structures 230.

Alternatively, the source/drain structures 230 are formed by, for example, epitaxial growth. In some embodiments, the epitaxial source/drain structures function as source/drain stressor to enhance carrier mobility of the semiconductor FET device 200. In some embodiments and when the resulting semiconductor FET device 200 is an n-type FET device, the source/drain structures 230 include SiP, SiC, SiPC, Si, III-V compound semiconductor materials, or combinations thereof. In some other embodiments and when the resulting semiconductor FET device 200 is a p-type FET device, the source/drain structures 230 include SiGe, SiGeC, Ge, Si, III-V compound semiconductor materials, or combinations thereof.

In some embodiments, when forming the source/drain structures 230 by epitaxial growth, portions of the fin structure 210 not covered by the sacrificial gate structure 220 are first removed to provide a fin segment 210P beneath the sacrificial gate structure 220. The fin segment 210P includes a first semiconductor segment 212P and a second semiconductor segment 214P, which are remaining portions of the first semiconductor strip 212 and the second semiconductor strip 214, respectively. In some embodiments, the portions of the fin structure 210 that are exposed by the sacrificial gate structure 220 are removed using an anisotropic etch that etches the semiconductor materials of the first semiconductor strip 212 and the second semiconductor strip 214 without substantially affecting the surrounding structures, including the substrate 202, the sacrificial gate cap 226, and the gate spacers 228. In some embodiments, the anisotropic etch is a dry etch, such as RIE. Subsequently, a semiconductor material is epitaxially deposited on exposed semiconductor surfaces such as surface of the substrate 202, the first semiconductor segment 212P, and the second semiconductor segment 214P, but not on dielectric surfaces such as surfaces of the isolation structures 204, the sacrificial gate cap 226, and the gate spacers 228. In some embodiments, when multiple fin structures 210 are present, the epitaxial growth process continues until the deposited semiconductor material merges adjacent fin segments 210P. Depending on the types of the semiconductor FET device 200 being formed (i.e., p-type FET or n-type FET), in the embodiments where the resulting semiconductor FET device 200 is a p-type FET device, the source/drain structures 230 include p-type dopants such as boron or BF$_2$, and in the embodiments where the resulting semiconductor FET device 200 is an n-type FET device, the source/drain structures 230 include n-type dopants such as phosphorous or arsenic. In some embodiments, the source/drain structures 230 are in-situ doped with n-type or p-type dopants during the epitaxial growth. In some embodiments, the source/drain structures 230 are undoped during the epitaxial growth process, and are doped during a subsequent doping process. The subsequent doping process is achieved by an ion implantation, plasma immersion ion implantation, gas and/or solid source diffusion, other suitable processes, and/or combinations thereof. In some embodiments, the source/drain structures 230 include phosphorous doped SiC for an n-type FET device. In some embodiments, the source/drain structures 230 include boron doped SiGe for a p-type FET device.

In some embodiments, the source/drain structures 230 are further exposed to an annealing process to activate the dopants in the source/drain structures 230 after forming the source/drain structures 230 and/or after the subsequent doping process. In some embodiments, the dopants in the source/drain structures 230 are activated by a thermal annealing process including a rapid thermal annealing process, a laser annealing process, or a furnace annealing process.

Referring to FIG. 1, at operation 108 of method 100, an interlevel dielectric (ILD) layer 232 is deposited over the source/drain structures 230 surrounding the sacrificial gate structure 220, as shown in FIG. 2D.

In some embodiments, the ILD layer 232 includes silicon oxide. Alternatively, in some embodiments, the ILD layer 232 includes a low-k dielectric material having a dielectric constant (k) less than 4. In some embodiments, the low-k dielectric material has a dielectric constant from about 1.2 to about 3.5. In some embodiments, the ILD layer 232 includes tetraethylorthosilicate (TEOS) oxide, undoped silicate glass, or doped silicate glass such as borophosphosilicate glass (BPSG), fluorosilica glass (FSG), phosphosilicate glass (PSG), boron doped silicon glass (BSG), and/or other suitable dielectric materials. In some embodiments, the ILD layer 232 is deposited by CVD, PECVD, PVD, or spin coating. In some embodiments, the ILD layer 232 is deposited to have a top surface above the topmost surface of the sacrificial gate structure 220 (e.g., the top surface of the sacrificial gate cap 226). The ILD layer 232 is subsequently planarized, for example, by CMP and/or a recess etch using the sacrificial gate cap 226 as a polishing and/or etch stop. After the planarization, the ILD layer 232 has a surface substantially coplanar with the topmost surface of the sacrificial gate structure 220.

Referring to FIG. 1, at operation 110 of method 100, the sacrificial gate stack 222, 224, 226 is removed to provide a cavity 234, as shown in FIG. 2E.

Various components of the sacrificial gate stack 222, 224, 226 are removed selectively to the semiconductor materials that provide the respective first semiconductor segment 212P and the second semiconductor segment 214P, and the dielectric materials that provide the respective gate spacers 228 and the ILD layer 232 by at least one etch. In some embodiments, the at least one etch is a dry etch such as RIE, a wet etch such as an ammonia etch, or a combination thereof. The cavity 234 occupies a volume from which the sacrificial gate stack 222, 224, 226 is removed and is laterally confined by inner sidewalls of the gate spacers 228. After removal of the sacrificial gate stack 222, 224, 226, sidewalls of the second semiconductor segment 214P and the underlying first semiconductor segment 212P are physically exposed by the cavity 234.

Referring to FIG. 1, at operation 112 of method 100, a nanostructure such as a nanowire structure 214N is formed to suspend over the substrate 202, as shown in FIG. 2F. It should be noted that although nanowires are described, other nanostructures, such as nanosheets and nanobars, are also contemplated in the present disclosure.

To form the nanowire structure 214N, the first semiconductor segment 212P is removed by etching. In some embodiments, the etch is an isotropic etch that removes the first semiconductor segment 212P selective to the second semiconductor segment 214P, the substrate 202, and the source/drain structures 230, causing the second semiconductor segment 214P to be suspended over the substrate 202. After etching, a gap 236 is formed between the substrate 202 and the second semiconductor segment 214P. Subsequently, the second semiconductor segment 214P is thinned and rounded by performing an annealing process in a hydrogen-containing atmosphere or through oxidation, and thereby provides the nanowire structure 214N. In some embodiments, the nanowire structure 214N has a circular-shaped or an elliptical-shaped cross section. In instances where the fin structure 210 includes multiple first and second semiconductor strips 212, 214, a plurality of vertically stacked nanowire structures are formed (not shown).

Referring to FIG. 1, at operation 114 of method 100, a functional gate stack 242, 244 is formed within the cavity 234 and the gap 236 between the nanowire structure 214N and the substrate 202, as shown in FIG. 2G. The functional gate stack 242, 244 wraps around the nanowire structure 214N, forming a gate all around (GAA) nanowire FET device. In some embodiments, the functional gate stack 242, 244 includes a gate dielectric 242 over exposed surfaces of the nanowires structure 214N and a gate electrode 244 over the gate dielectric 242. The functional gate stack 242, 244 and the gate spacers 228 laterally surrounding the functional gate stack 242, 244 together define a functional gate structure 242, 244, 228.

The functional gate stack 242, 244 includes a first portion within the cavity 234 and a second portion within the gap 236. In the cavity 234, the gate dielectric 242 is U-shaped having a horizontal portion in direct contact with an upper surface of the nanowire structure 214N and vertical portions that are located on exposed sidewalls of the gate spacers 228 laterally surrounding the cavity 234. Within the gap 236, the gate dielectric 242 surrounds the gate electrode 244.

In some embodiments, the gate dielectric 242 includes a high-k dielectric material having a dielectric constant greater than silicon oxide. Exemplary high-k dielectric materials include, but are not limited to, hafnium oxide ($HfO_2$), zirconium oxide ($ZrO_2$), lanthanum oxide ($La_2O_3$), aluminum oxide ($Al_2O_3$), titanium oxide ($TiO_2$), strontium titanium oxide ($SrTiO_3$), lanthanum Aluminum oxide ($LaAlO_3$), and yttrium oxide ($Y_2O_3$). In some embodiments, a multilayered gate dielectric structure comprising different gate dielectric materials, e.g., silicon oxide, and a high-k gate dielectric is formed. In some embodiments, the gate electrode 244 includes a conductive metal such as, for example, tungsten (W), copper (Cu), aluminum (Al), cobalt (Co), or alloys thereof.

To form the functional gate stack 242, 244, a gate dielectric layer is deposited over exposed surfaces of the ILD layer 232, the cavity 234 and the gap 236. In some embodiments, the gate dielectric layer is deposited by a suitable conformal deposition process such as CVD or ALD. A conductive material layer is deposited over the gate dielectric layer to fill the cavity 234 and the gap 236. In some embodiments, the conductive material layer is deposited by CVD, PECVD, or PVD. A planarization process, such as CMP is performed to remove portions of the conductive material layer and the gate dielectric layer from the top surface of the dielectric layer. The remaining portion of the conductive material layer within the cavity 234 and the gap 236 constitutes the gate electrode 244, and the remaining portion of the gate dielectric layer within the cavity 234 and the gap 236 constitutes the gate dielectric 242.

Referring to FIG. 1, at operation 116 of method 100, a contact level dielectric layer 250 is deposited over the ILD layer 232 and the functional gate structure 242, 244, 228, as shown in FIG. 2H.

In some embodiments, the contact level dielectric layer 250 includes a dielectric material such as, for example, silicon dioxide, TEOS, undoped silicate glass, or doped silicate glass such as BPSG, FSG, PSG, or BSG. In some embodiments, the contact level dielectric layer 250 includes a dielectric material the same as the dielectric material of the ILD layer 232. In some embodiments, the contact level dielectric layer 250 includes a dielectric material different from the dielectric material of the ILD layer 232. In some embodiments, the contact level dielectric layer 250 is deposited, for example, using CVD, PECVD, PVD, or spin coating. In some embodiments, if the contact level dielectric layer 250 is not self-planarizing, a top surface of the contact level dielectric layer 250 is planarized, for example, by CMP. The planarized top surface of the contact level dielectric layer 250 is located above topmost surfaces of the functional gate structures 242, 244, 228. Though not illustrated in FIG. 2H, in some embodiments, a hard mask layer can be provided over contact level dielectric layer 250.

Referring to FIG. 1, at operation 118 of method 100, features such as source/drain contact openings 252 are formed within the a layer on substrate 202, e.g., contact level dielectric layer 250 and the ILD layer 232, as shown in FIG. 2I. Each of the source/drain contact openings 252 extends through the contact level dielectric layer 250 and the ILD layer 232, exposing a portion of a corresponding source/drain structure 230. Portions of the source/drain structures 230 that are exposed by respective source/drain contact openings 252 are herein referred to as source/drain contact regions 230C.

In some embodiments, the source/drain contact openings 252 are formed by applying a layer of light-sensitive material, e.g., a photoresist layer 260 over the contact level dielectric layer 250 (and hard mask layer if present), and then lithographically patterning the photoresist layer 260 to form openings 252 therein. Each opening overlies a portion of one of the source/drain structures 230. The pattern in the photoresist layer is transferred through the hard mask layer if present, the contact level dielectric layer 250 and the ILD layer 232 using an anisotropic etch to form the source/drain contact openings 252. In some embodiments, a dry etch such as, for example, RIE or plasma etch is performed to remove exposed portions of the hard mask layer if present, the contact level dielectric layer 250 and the ILD layer 232. In some embodiments and as shown, the source/drain contact openings 252 are formed to have substantially vertical sidewalls. In some embodiments, the source/drain contact openings 252 are formed to have tapered sidewalls. After formation of the source/drain contact openings 252, the remaining photoresist layer needs to be removed before further processing, for example, by ashing.

Figure 3:
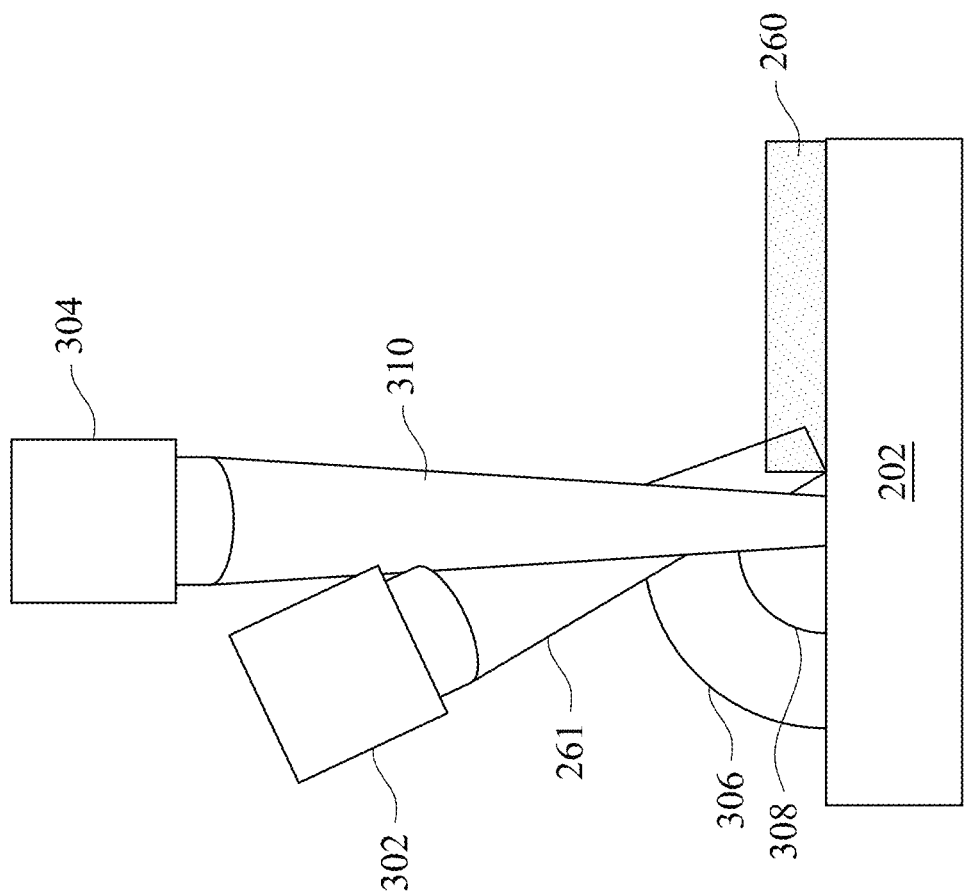
FIG. 3 is a schematic illustration of an embodiment for removing photoresist from a workpiece, in accordance with some embodiments.
Figure 4:
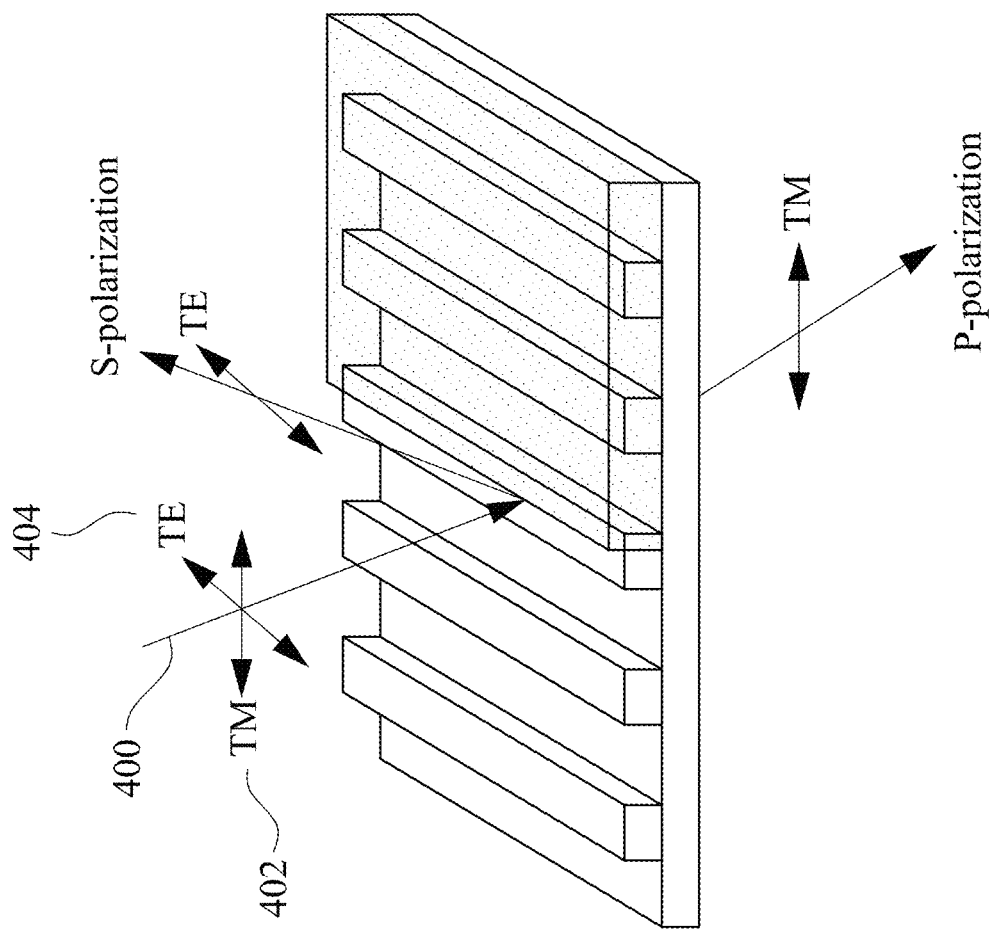
FIG. 4 is a schematic illustration of reflection of S polarized electromagnetic radiation and transmission of P polarized electromagnetic radiation.

Referring to FIGS. 1 and 3, at operation 120, patterned photoresist 260P is removed in accordance with embodiments of the present disclosure, prior to a subsequent annealing process to be carried out on workpiece 202. In the embodiment illustrated in FIG. 3, the removal of photoresist 260 and annealing of portions of workpiece 202 are carried out in a common chamber which are capable of being supplied with electromagnetic radiation from electromagnetic radiation source 302 and electromagnetic radiation source 304. In some embodiments of the present disclosure, processes of the removal of photoresist and annealing are performed in-situ. In some embodiments of the present disclosure, processes of the removal of photoresist and annealing are performed with respective lasers as described below in more detail. In some embodiments of the present disclosure, processes of the removal of photoresist and annealing are performed by two steps respectively. In some embodiments, processes of the removal of photoresist is performed by S-polarized laser as described below in more detail. In some embodiments, annealing is performed by P-polarized laser or non-polarized laser as described below in more detail. Patterned photoresist 260P is removed utilizing electromagnetic radiation without exposing the workpiece and features formed in the workpiece to electromagnetic radiation that would directly damage such features or elevate the temperature of the workpiece or features formed in the workpiece to levels that would damage such features. For example, portions of the contact level dielectric 250 (and features thereunder) underlying the patterned photoresist 260P are protected from the electromagnetic radiation used to remove the photoresist by a hard mask layer when present. In accordance with embodiments of the present disclosure, patterned photoresist 260P is removed using electromagnetic radiation without damaging (e.g., deactivating) the source/drain contact regions 230C. The length of time portions of the workpiece are subjected to the electromagnetic radiation to remove the light-sensitive material is such that the temperature of such portions of the workpiece are not elevated so long that damage to such portions occurs, e.g., deactivation of dopants in the workpiece. Suitable dwell times for exposing the workpiece to electromagnetic radiation to remove the light-sensitive materials is between 10 nanoseconds to 500 microseconds. For example, at operation 120, the patterned photoresist 260P is exposed to electromagnetic radiation 261, e.g., laser energy, generated by a source of electromagnetic radiation 302. In accordance with embodiments of the present disclosure, electromagnetic radiation 261 is polarized radiation. Polarized radiation refers to radiation that includes transverse waves that oscillate in a direction perpendicular to the direction of motion of the wave. Referring to FIG. 4, electromagnetic radiation 400 includes a transverse magnetic field 402 (TM) and a transverse electric field 404 (TE). The transverse magnetic field 402 is also referred to as P-polarized radiation and is polarized parallel to the plane of incidence. Transverse electric field 404 is referred to as S-polarization and is polarized perpendicular to the plane of incidence. As illustrated in FIG. 4, the S-polarized radiation TE is reflected at the surface of the substrate, especially by metal features on the surface of the substrate. In contrast, the P polarized radiation TM is transmitted through the metal features on the surface of the substrate and the substrate. In FIG. 3, the S polarized radiation has an oblique incident angle 306 ranging between 0° and 90° and the P polarized radiation has an oblique incident angle 308 of 90°. Embodiments in accordance with the present disclosure are not limited to the incident angles illustrated in FIG. 3. For example, embodiments in accordance with the present disclosure can have incident angles that are different than those illustrated in FIG. 3. In accordance with embodiments of the present disclosure, S polarized radiation 261 has a wavelength ranging between 100 nanometers and 10 micrometers. Embodiments of the present disclosure are not limited to S polarized radiation having a wavelength falling within these ranges. For example, other embodiments may utilize S polarized radiation that has a wavelength outside these ranges. In accordance with embodiments of the present disclosure, the S polarized radiation has an energy of 0.1 J/cm² to 1 J/cm². In some embodiments, an excimer laser such as a XeCl laser, or a KrF laser is used. The S polarized radiation can be provided by filtering or polarizing light generated from the source of electromagnetic radiation or the S polarized radiation can be generated directly by the source of electromagnetic radiation.

In the embodiment of FIG. 3, after the S polarized electromagnetic radiation has removed the light-sensitive material 260, electromagnetic radiation 310 from source 304 is generated and utilized to anneal portions of substrate 202. Electromagnetic radiation 310 from source 304 is either P polarized or non-polarized magnetic radiation. In embodiments where electromagnetic radiation 310 is P polarized, such electromagnetic radiation is either directly generated by electromagnetic radiation source 304 without passing through a polarizer or it is generated by passing non-polarized electromagnetic radiation generated by source 304 through a polarizer (not shown). Characteristics of electromagnetic radiation 310 are chosen so that electromagnetic radiation 310 is able to elevate the temperature of the portions of substrate 202 to be annealed sufficiently without exceeding the thermal budget of the process which could result in unwanted damage to features surrounding the portion of the substrate 202 to be annealed. For example, the annealing can activate dopants in the source/drain contact regions 230C without damaging surrounding structures such as the channel. For example, in accordance with embodiments of the present disclosure, P polarized radiation has a wavelength ranging between 100 nanometers and 10 micrometers. Embodiments of the present disclosure are not limited to P polarized radiation having a wavelength falling within these ranges. For example, other embodiments may utilize S polarized radiation that has a wavelength outside these ranges. In accordance with embodiments of the present disclosure, the P polarized radiation has an energy of 0.1 J/cm$^2$ to 1 J/cm$^2$. In some embodiments, an excimer laser such as a XeCl laser, or a KrF laser is used.

Referring to FIG. 1, at operation 122 of method 100, after the light-sensitive material 260 has been removed as described above, conductive plugs 254 are formed in the source/drain contact openings 252, as shown in FIG. 2J. The conductive plugs 254 contact respective source/drain contact regions 230C, and are self-aligned with the source/drain contact regions 230C.

The conductive plugs 254 are formed of a material having good thermal conductivity, and are used as local heat conductors to facilitate conduction of heat from the conductive plugs 254 to respective underlying source/drain contact regions 230C. Thus, the presence of the conductive plugs 254 helps to increase dopant activation efficiency at the source/drain contact regions 230C. In some embodiments, the thermal conductivity of the conductive plugs 254 is greater than about 1 W/m*K. In addition, the material of high thermal conductivity that provides the conductive plugs 254 is able to absorb laser irradiation and generate heat more efficiently than in the case where the laser irradiation is directly incident on the semiconductor regions (i.e., source/drain contact regions 230C), which leads to higher temperature in the source/drain contact regions 230C. Thus, the presence of the conductive plugs 254 allows using a laser source with less laser energy to activate sufficient amount of dopants in the source/drain contact regions 230C. As a result, the manufacturing cost is reduced.

In some embodiments, the conductive plugs 254 are sacrificial structures and are replaced with functional contact structures, e.g., source/drain contact structures 270 (FIG. 2M) in later process. In some embodiments, the conductive plugs 254 include titanium nitride (TiN), nickel (Ni), or Co.

In some embodiments, the conductive plugs 254 are functional contacts structures for providing electrical connections to the source/drain structures 230 in the semiconductor FET device 200. In some embodiments, the conductive plugs 254 include Cu, W, Al, or an alloy thereof. In some embodiments, each of the conductive plugs 254 is surrounded by a contact liner (not shown) which separates the conductive plug 254 from the contact level dielectric layer 250 and ILD layer 232. In some embodiments, the contact liner includes titanium (Ti), tantalum (Ta), nickel (Ni), ruthenium (Ru), TiN, tantalum nitride (TaN), ruthenium nitride (RuN), an alloy thereof, or a stack thereof such as Ti/TiN or Ta/TaN.

The conductive plugs 254 are formed by filling the source/drain contact openings 252 with a conductive material. In some embodiments, the conductive material is deposited using a deposition technique, such as CVD, PECVD, or PVD. During the deposition process, some amount of the conductive material is deposited over the top surface of the contact level dielectric layer 250. This overburden conductive material is subsequently removed from the top surface of the contact level dielectric layer 250, for example, by a planarization process. In some embodiments, CMP is performed to remove the overburden conductive material. After planarization, the top surfaces of the conductive plugs 254 are substantially coplanar with the top surface of the contact level dielectric layer 250. In some embodiments, before depositing the conductive material for formation of the conductive plugs 254, a contact liner material is deposited along sidewalls and bottom surfaces of the source/drain contact openings 252 to line the conductive plugs 254.

Referring to FIG. 1, at operation 124 of method 100, a laser annealing process is performed to activate dopants in the source/drain contact regions 230C, as shown in FIG. 2K. In some embodiments, the laser annealing process is performed using a laser source that directs laser irradiation, as illustrated by arrows 262, to the conductive plugs 254. In some embodiments, the laser source is pulsed in a nanosecond duration such that the laser irradiation 262 only penetrates into shallow surface portions of the conductive plugs 254 and the contact level dielectric layer 250. In some embodiments, the penetration depth of the laser irradiation 262 is controlled to be no greater than 10 nm, thus preventing over-heating the functional gate structure 242, 244, 228 and the nanowire structure 214N. The source of the laser for the laser annealing process at operation 124 can be the same as or different from the laser utilized to remove photoresist in operation 120. If the laser for use in operation 124 is the same laser used in operation 120, such laser must be capable of generating electromagnetic radiation at the wavelength's desired for carrying out the photoresist removal and the laser annealing operations steps. If the laser for use in operation 124 is not the same laser used in operation 120, then the laser for use in operation 124 may be optically coupled to the same chamber in which the photoresist removal operation 120 is carried out. Alternatively, operation 120 can be carried out in one chamber and operation 124 can be carried out in a different chamber.

The laser irradiation 262 that is incident onto the conductive plugs 254 is absorbed by the conductive plugs 254. The absorbed light in the conductive plugs 254 is converted to heat due to the coupling between the incident light and electrons in the conductive plugs 254. The heat is dissipated to the source/drain contact region 230C to activate the dopants in the source/drain contact regions 230C. Thus, the conductive plugs 254 help to divert more heat to the source/drain contact regions 230C compared to the case where no conductive plugs 254 are present and the laser irradiation 262 is directly incident on the source/drain contact regions 230C. As result, the dopant activation efficiency is enhanced. As a result, the thermal damage to the functional gate structure 242, 244, 228 and the nanowire structure 214N is prevented.

In some embodiments, the laser irradiation 262 is performed by irradiating a single laser pulse or a plurality of laser pulses that impinges onto the light blocking layer 260. In some embodiments, the total duration of the single laser pulse or the plurality of laser pulses is less than 200 nanoseconds (ns). In some embodiments, the total duration of the single laser pulse or the plurality of laser pulses is in a range from about 1 ns to about 60 ns.

As a result, the functional gate structure 242, 244, 228 and the nanowire structure 214N are not over-heated during the laser annealing process, and the thermal damage to the functional gate structure 242, 244, 228 and the nanowire structure 214N caused by the laser annealing is prevented. In some embodiments, the laser irradiation 262 has a wavelength from about 300 nm to about 600 nm. In some embodiments, the energy of the laser irradiation 262 is from about 0.05 J/cm² to about 0.2 J/cm². In some embodiments, an excimer laser such as a XeCl laser or a KrF laser is used.

In accordance with other embodiments, the laser annealing process can be carried out directly upon the source/drain contact regions 230C before the conductive plugs 254 are formed thereover.

Referring to FIG. 1, at operation 126 of method 100, the conductive plugs 254 are removed from the source/drain contact openings 252, re-exposing the source/drain contact regions 230C at the bottoms of the source/drain contact openings 252, as shown in FIG. 2L.

The conductive plugs 254 are removed, for example, by an etch. The etch can be an anisotropic etch or an isotropic etch that removes material of the conductive plugs 254 selective to materials of the contact level dielectric layer 250, the ILD layer 232 and the source/drain contact regions 230C. In some embodiments, the conductive plugs 254 are removed using an ammonia and hydrogen peroxide mixture (APM). In some embodiments, the APM solution includes a mixture of ammonium hydroxide ($NH_4OH$), hydrogen peroxide ($H_2O_2$), and de-ionized water ($H_2O$).

Referring to FIG. 1, at operation 128 of method 100, source/drain contact structures 270 are formed in the source/drain contact openings 252, as shown in FIG. 2M.

In some embodiments, each of the source/drain contact structures 270 includes a contact liner 272 present on sidewall and bottom surfaces of a corresponding source/drain contact opening 252 and a contact plug 274 surrounded by the contact liner 272.

The source/drain contact structures 270 are formed by first depositing a contact liner layer (not shown) along sidewalls and bottom surfaces of the source/drain contact openings 252 and over the top surface of the contact level dielectric layer 250. The contact liner layer includes an elemental metal or a metallic compound that prevents diffusion of metal in the contact plug 274 into the contact level dielectric layer 250 and the ILD layer 232. In some embodiments, the contact liner layer includes Ti, Ta, Ni, Ru, TiN, TaN, RuN, an alloy thereof, or a stack thereof such as Ti/TiN or Ta/TaN. In some embodiments, the contact liner layer is deposited using a conformal deposition process including, for example, CVD, PECVD, PVD, or ALD.

A contact material layer (not shown) is then deposited over the contact liner layer to fill the source/drain contact openings 252. In some embodiments, the contact material layer includes an electrically conductive metal such as, for example, Cu, W, Al, Co, or an alloy thereof. In some embodiments, the contact material layer is formed utilizing a deposition process such as, for example, CVD, PECVD, PVD, or plating. The deposition process is continued until the contact material layer fills the source/drain contact openings 252 and extends above the contact level dielectric layer 250. In some embodiments, when Cu or a Cu alloy is employed in the contact material layer, an optional plating seed layer (not shown) is formed on the contact liner layer 272 prior to the formation of the conductive layer. In some embodiments, the optional plating seed layer is formed by a deposition process including, for example, CVD, PECVD, ALD, and PVD.

Subsequently, portions of the contact material layer and the contact liner layer that are located above the top surface of the contact level dielectric layer 250 are removed using a planarization process. In some embodiments, a CMP process is performed. After the planarization, a portion of the contact material layer remaining in each source/drain contact opening 252 constitutes a contact plug 274 and a portion of the contact liner layer remaining in each source/drain contact opening 252 constitutes a contact liner 272. Top surfaces of the contact plug 274 and the contact liner 272 are substantially coplanar with the top surface of the contact level dielectric layer 250.

Replacing the conductive plugs 254 with the source/drain contact structures 270 helps to eliminate any damages to the conductive plugs 254 during the laser anneal process. As a result, the reliability of the semiconductor FET device 200 is increased.

Operations 126 and 128 are optional and in some embodiments are omitted. If operations 126 and 128 are not performed, the conductive plugs 254 serve as source/drain contact structures for the semiconductor FET device 200.

Figure 5:
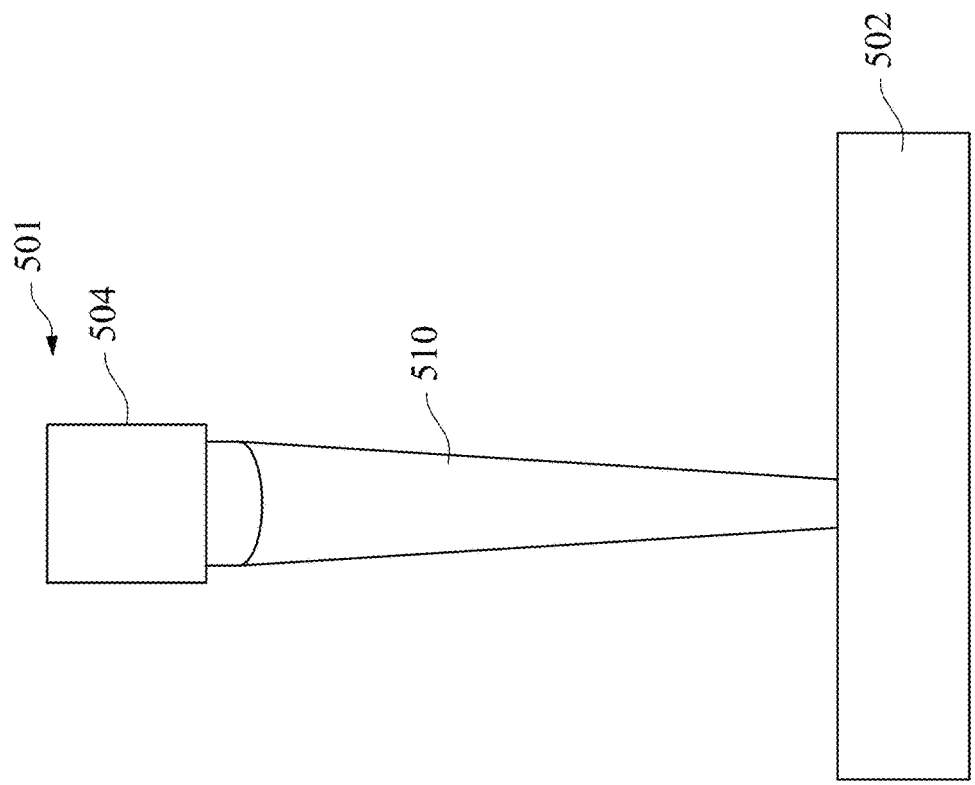
FIG. 5 is a schematic illustration of another embodiment for removing photoresist from a workpiece, in accordance with some embodiments.
Figure 5:
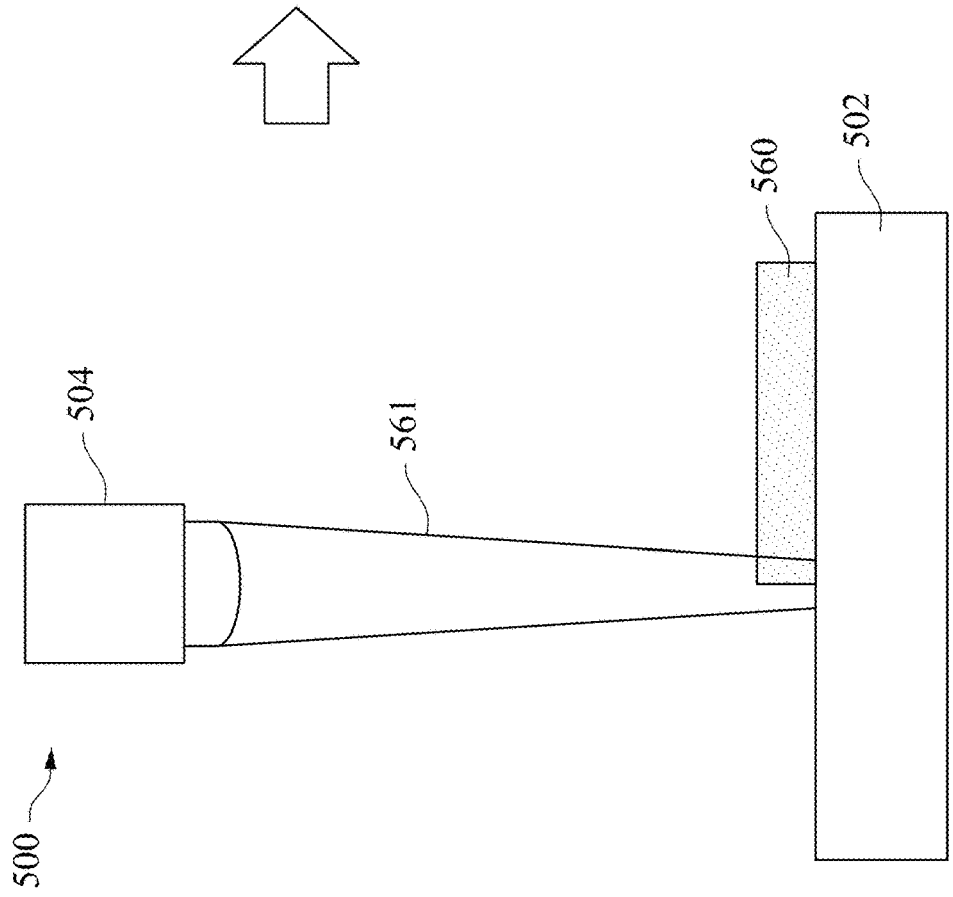

Referring to FIG. 5, a different embodiment of the present disclosure is illustrated whereby S polarized electromagnetic radiation 561 from source 504 is utilized to remove photoresist 560 from the workpiece 502 at operation 500. The description above regarding how photoresist 260 is removed from a workpiece 202 with reference to FIG. 2 is equally applicable to how photoresist 560 is removed from workpiece 502 in FIG. 5. In FIG. 5, after photoresist 560 has been removed, workpiece 502 is subjected to a laser anneal process 501 whereby polarized or non-polarized electromagnetic radiation 510 from source 504 is directed toward portions of wafer 502. The description above regarding how portions of a workpiece 202 are laser annealed with reference to FIG. 2 is equally applicable to how workpiece 502 in FIG. 5 is laser annealed. In contrast to the embodiment described above with reference to FIG. 3, the embodiment of FIG. 5 carries out photoresist removal in one chamber or tool and carries out laser annealing of wafer 502 in a different chamber or tool.

Figure 6:
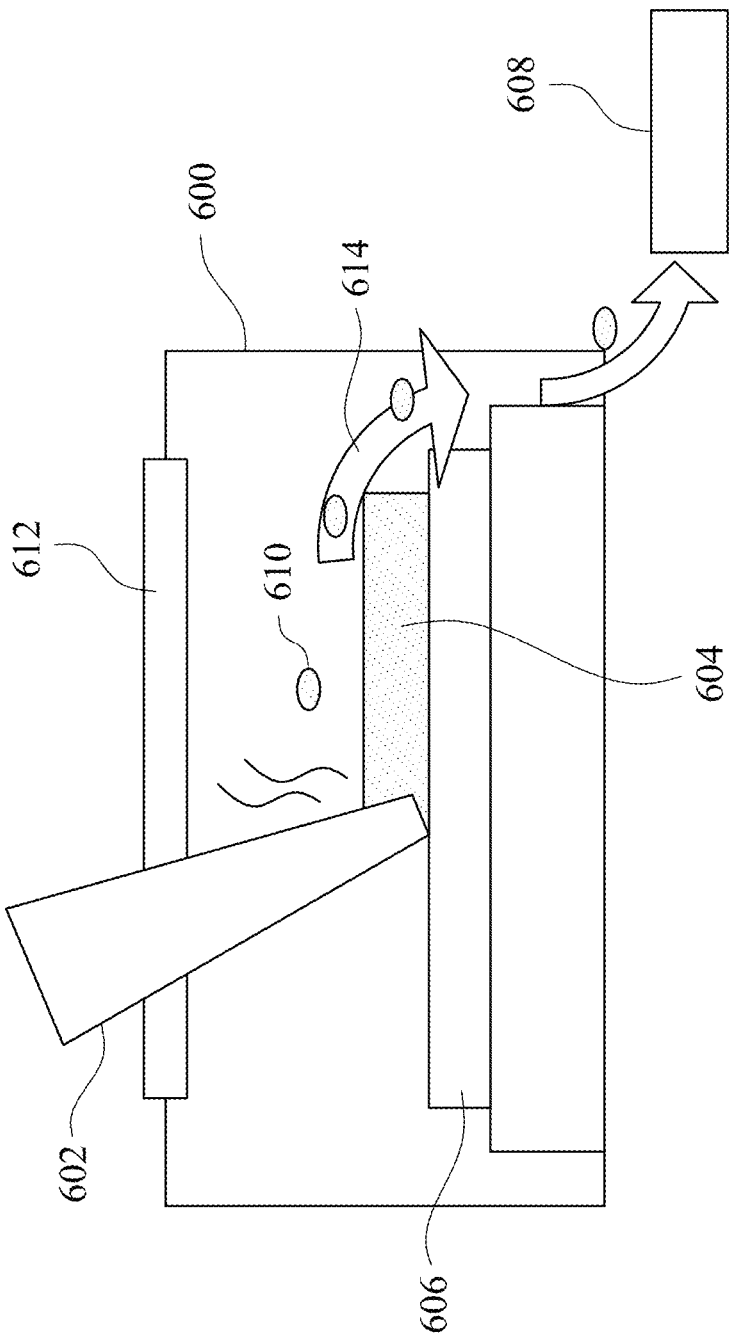
FIG. 6 is a schematic illustration of another embodiment for removing photoresist from a workpiece, in accordance with some embodiments.

Referring to FIG. 6 and in accordance with another aspect of the present disclosure, a described embodiment includes a chamber 600 in which electromagnetic radiation 602 is utilized to remove photoresist 604 from a wafer 606 surface. Photoresist 604 that is ashed from a surface of wafer 606 produces vapor or particulate material 610 that if not removed from chamber 600 can deposit onto surfaces within chamber 600. For example, ashed photoresist material 610 can deposit onto an underside of window 612 formed in the top surface of chamber 600. When photoresist material 610 deposits on the underside of window 612, subsequent processes carried out in chamber 600 which require that window 612 be clear and clean such that electromagnetic energy directed at window 612 passes unattenuated or only slightly attenuated through window 612 are impacted. For example, photoresist material 610 on the underside of window 612 can attenuate electromagnetic energy directed through window 612. If electromagnetic radiation incident on window 612 is attenuated by photoresist material collected on window 612, the effectiveness of the process utilizing such electromagnetic radiation can be adversely affected. For example, if the process utilizing electromagnetic radiation is a laser annealing process, accumulation of photoresist on window 612 can reduce the ability of the laser anneal process to heat portions of the wafer to the necessary temperature. Manually removing the photoresist material 610 that deposits on the underside of window 612 is a time consuming process which reduces throughput of the process. In accordance with this embodiment of the present disclosure, chamber 600 includes an exhaust system 608 which is utilized to draw vaporized photoresist or particulate photoresist 610 from chamber 600 during the photoresist removal step. In FIG. 6, removal of the vaporized photoresist or particulate photoresist 610 is schematically illustrated by arrow 614. Exhaust system 608 includes pumps or other devices capable of drawing a vacuum on chamber 600, effectively, sucking out the vaporized photoresist or particulate photoresist 610 from chamber 600.

One aspect of this description relates to a method of forming a semiconductor device. The method includes forming at least one layer of conductive and nonconductive material over a substrate. A layer of light-sensitive material is deposited over this at least one layer. The method includes removing a portion of the light-sensitive material and exposing remaining portions of the light-sensitive material to a polarized electromagnetic radiation. The polarized electromagnetic radiation removes the remaining portions of the light-sensitive material. Thereafter, a second polarized electromagnetic radiation is directed to a feature on the substrate. This second polarized electromagnetic radiation is polarized in a direction different from a direction the polarized electromagnetic radiation to which the layer of light-sensitive material is exposed.

Another aspect of this description relates to a method of forming a semiconductor device. The method includes forming a field effect transistor (FET) device over a substrate. The FET device includes a nanostructure channel, a gate structure around the nanostructure channel, and source/drain structures on opposite sides of the gate structure. The gate structure is surrounded by a first dielectric layer. The method further includes depositing a second dielectric layer over the gate structure and the first dielectric layer. The method further includes depositing a light-sensitive material over the second dielectric layer. The method further includes patterning the light-sensitive material to provide a pattern light-sensitive material. The first dielectric layer and the second dielectric layer are etched to form source drain contact openings which expose source drain contact regions of the source drain structures. The method includes removing the pattern light-sensitive material by exposing the pattern light-sensitive material to a polarized electromagnetic radiation. Contact plugs are then formed in the source drain contact openings and an annealing process is carried out to activate dopants in the source drain contact regions by directing electromagnetic radiation to the conductive plugs. In other embodiments, the annealing process is carried out directly on the source/drain contact structures before the conductive plugs are formed. In some embodiments, the electromagnetic radiation of the annealing process is polarized in a direction different from the direction that the polarized electromagnetic radiation used to remove the pattern light-sensitive material is polarized.

Still another aspect of this description relates to a method of forming a semiconductor device. The method includes forming at least one conductive and nonconductive layer over a substrate. The method includes forming a layer of light-sensitive material over the at least one layer of conductive or nonconductive material. The light-sensitive material is patterned to produce a patterned light-sensitive material. The pattern of the pattern light-sensitive material is transferred to the at least one layer of conductive or nonconductive material. The method includes, in a chamber, removing the layer of patterned light-sensitive material from the at least one layer of conductive and nonconductive material by exposing the patterned light-sensitive material to polarized electromagnetic radiation. In some embodiments the polarized electromagnetic radiation is S polarized electromagnetic radiation. The method includes exhausting from the chamber, portions of the light-sensitive material removed by exposing the pattern light-sensitive material to the polarized electromagnetic radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming at least one layer over a substrate;
    forming a layer of light-sensitive material over the at least one layer;
    removing a portion of the layer of light-sensitive material;
    exposing remaining portions of the layer of light-sensitive material to a polarized electromagnetic radiation; and
    directing a polarized electromagnetic radiation to a feature on the substrate, the polarized electromagnetic radiation to which the remaining portions of the layer of light-sensitive material is exposed being polarized in a direction different from a direction the polarized electromagnetic radiation directed to a feature on the substrate is polarized.

2. The method of claim 1, further comprising removing a portion of the at least one layer.

3. The method of claim 2, further comprising forming a conductive feature where the portion of the at least one layer is removed.

4. The method of claim 3, wherein the conductive feature is Cu, W, Al or an alloy thereof.

5. The method of claim 1, wherein the light-sensitive material is a photoresist.

6. The method of claim 5, wherein the polarized electromagnetic radiation to which the remaining portions of the layer of light-sensitive material is exposed is an S polarized electromagnetic radiation.

7. The method of claim 6, wherein the polarized electromagnetic radiation to which the feature on the substrate is exposed is a P polarized electromagnetic radiation.

8. The method of claim 1, wherein the polarized electromagnetic radiation to which the remaining portions of the layer of light-sensitive material is exposed is an S polarized laser.

9. The method of claim 1, wherein the polarized electromagnetic radiation to which the feature on the substrate is exposed is a P polarized laser.

10. The method of claim 1, wherein the exposing the layer of light-sensitive material to a polarized electromagnetic radiation removes at least a portion of the light-sensitive material.

11. The method of claim 1, wherein the directing a polarized electromagnetic radiation to the feature on the substrate anneals the feature.

12. The method of claim 11, wherein the directing a polarized electromagnetic radiation to the feature on the substrate activates dopants in the feature.

13. A method of forming a semiconductor device, comprising:
    forming at least one layer over a substrate;
    forming a layer of light-sensitive material over the at least one layer;

patterning the light-sensitive material to produce a patterned light-sensitive material;

transferring the pattern of the patterned light-sensitive material to the at least one layer;

in a chamber, removing the patterned light-sensitive material from the at least one layer by exposing the patterned light-sensitive material to polarized electromagnetic radiation; and exhausting from the chamber, portions of the light-sensitive material removed by exposing the patterned light-sensitive material to the polarized electromagnetic radiation.

14. The method of claim 13, further comprising: annealing a portion of the substrate by directing a P polarized or non-polarized electromagnetic radiation at the portion of the substrate.

15. The method of claim 13, wherein the removing the layer of patterned light-sensitive material from the at least one layer by exposing the patterned light-sensitive material to polarized electromagnetic radiation includes exposing the patterned light sensitive material to S polarized electromagnetic radiation and reflecting the S polarized electromagnetic radiation from the substrate or features formed on the substrate.

16. A method of forming a semiconductor device comprising:

forming at least one layer over a substrate;

forming a layer of light-sensitive material over the at least one layer;

removing a portion of the layer of light-sensitive material;

in a chamber, exposing remaining portions of the layer of light-sensitive material to a polarized electromagnetic radiation; and in the chamber, directing a polarized electromagnetic radiation to a feature on the substrate, the polarized electromagnetic radiation to which the remaining portions of the layer of light-sensitive material is exposed being polarized in a direction different from a direction the polarized electromagnetic radiation directed to a feature on the substrate is polarized.

17. The method of claim 16, wherein the directing a polarized electromagnetic radiation to a feature on the substrate includes annealing a portion of the substrate by directing a P polarized electromagnetic radiation at the feature on the substrate.

18. The method of claim 16, wherein the exposing remaining portions of the layer of light-sensitive material to a polarized electromagnetic radiation includes exposing the remaining portions of the layer of light-sensitive material to S polarized electromagnetic radiation.

19. The method of claim 18, further comprising reflecting the S polarized electromagnetic radiation from the substrate or features formed on the substrate.

20. The method of claim 16, further comprising exhausting from the chamber, portions of the remaining portions of the light-sensitive material exposed to the polarized electromagnetic radiation.

\* \* \* \* \*